(12) United States Patent
Yun et al.

(10) Patent No.: US 12,495,709 B2
(45) Date of Patent: Dec. 9, 2025

(54) LIGHT EMITTING DISPLAY DEVICE INCLUDING LIGHT BLOCKING MEMBER HAVING AN OPENING AND MANUFACTURING METHOD THEREOF

(71) Applicant: Samsung Display Co., LTD., Yongin-si (KR)

(72) Inventors: Hae Young Yun, Yongin-si (KR); Seong Min Wang, Yongin-si (KR); Ji Won Sohn, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 483 days.

(21) Appl. No.: 17/989,219

(22) Filed: Nov. 17, 2022

(65) Prior Publication Data

US 2023/0329035 A1 Oct. 12, 2023

(30) Foreign Application Priority Data

Apr. 12, 2022 (KR) .................. 10-2022-0045288

(51) Int. Cl.
*H10K 59/80* (2023.01)
*H10K 59/12* (2023.01)
*H10K 59/122* (2023.01)
*H10K 59/38* (2023.01)
*H10K 71/00* (2023.01)

(52) U.S. Cl.
CPC ......... *H10K 59/8792* (2023.02); *H10K 59/38* (2023.02); *H10K 71/00* (2023.02); *H10K 59/1201* (2023.02); *H10K 59/122* (2023.02)

(58) Field of Classification Search
CPC .. H10K 50/865; H10K 59/8792; H10K 59/38; H10K 71/00; H10K 59/1201; H10H 29/142
See application file for complete search history.

(56) References Cited

U.S. PATENT DOCUMENTS

| | | |
|---|---|---|
| 7,068,287 B2 | 6/2006 | Credelle |
| 7,492,379 B2 | 2/2009 | Credelle et al. |
| 8,134,583 B2 | 3/2012 | Credelle |
| 8,456,496 B2 | 6/2013 | Credelle |

(Continued)

FOREIGN PATENT DOCUMENTS

| | | |
|---|---|---|
| KR | 10-2016-0148113 | 12/2016 |
| KR | 10-2018-0061853 | 6/2018 |

(Continued)

*Primary Examiner* — Nduka E Ojeh
(74) *Attorney, Agent, or Firm* — Womble Bond Dickinson (US) LLP

(57) ABSTRACT

In a light emitting display device, a light blocking member is positioned on an encapsulation layer and includes a red opening, a blue opening, and a green opening. The red opening, the blue opening, and the green opening have a mass center, a first position closest to the mass center, and a second position furthest from the mass center. In case that a ratio of a distance from the mass center to the second position to a distance from the mass center to the first position is referred to as a maximum minimum distance ratio, the red opening has a value of about 1.02 or more and about 1.15 or less, the blue opening has a value of about 1.05 or more and about 1.2 or less, and the green opening has a value of about 1.32 or more and about 1.38.

20 Claims, 28 Drawing Sheets

(56) References Cited

U.S. PATENT DOCUMENTS

| | | |
|---|---|---|
| 9,431,469 B2 | 8/2016 | Park et al. |
| 9,484,391 B2 | 11/2016 | Kwon |
| 9,818,803 B2 | 11/2017 | Lee |
| 9,837,476 B2 | 12/2017 | Park et al. |
| 10,347,703 B2 | 7/2019 | Park et al. |
| 10,832,616 B2 | 11/2020 | Lee |
| 10,854,687 B2 | 12/2020 | Joo et al. |
| 10,864,683 B2 | 12/2020 | Tsurugai et al. |
| 10,878,746 B2 | 12/2020 | Yang et al. |
| 10,896,939 B2 | 1/2021 | Jeon et al. |
| 2022/0271098 A1* | 8/2022 | Xu .................. H10K 59/126 |
| 2023/0087603 A1* | 3/2023 | Wang ................ H10K 59/353 257/40 |
| 2025/0017088 A1* | 1/2025 | Hu ................... H10K 59/8792 |

FOREIGN PATENT DOCUMENTS

| | | |
|---|---|---|
| KR | 10-2019-0047235 | 5/2019 |
| KR | 10-2021-0005290 | 1/2021 |

\* cited by examiner

LIGHT EMITTING DISPLAY DEVICE INCLUDING LIGHT BLOCKING MEMBER HAVING AN OPENING AND MANUFACTURING METHOD THEREOF

CROSS-REFERENCE TO RELATED APPLICATION(S)

This application claims priority to and benefits of Korean Patent Application No. 10-2022-0045288 under 35 U.S.C. § 119, filed in the Korean Intellectual Property Office on Apr. 12, 2022, the entire contents of which are incorporated herein by reference.

BACKGROUND

1. Technical Field

The disclosure relates to a structure and a manufacturing method of an opening formed in a light blocking member positioned on a front side of a light emitting display device.

2. Description of the Related Art

A display device is a device that displays a screen, and may include a liquid crystal display (LCD), an organic light emission diode (OLED), and the like. A display device may be used in various electronic devices such as a mobile phone, a navigation device, a digital camera, an electronic book, a portable game machine, and various terminals.

A display device such as an organic light emitting device may have a structure in which the display device may be bent or folded using a flexible substrate.

In small electronic devices such as portable phones, optical elements such as cameras and optical sensors may be formed in a bezel region, which may be the periphery of the display area, however as the size of the peripheral area of the display area is gradually reduced while the size of the displayed screen is increased, a technology capable of positioning the cameras or optical sensors on the back of the display area is being developed, and a structure that may not form a polarizer on the front of the display device is being developed to improve the efficiency of the optical sensor.

The above information disclosed in this Background section is only for enhancement of understanding of the background of the described technology, and therefore it may contain information that does not form the prior art that is already known in this country to a person of ordinary skill in the art.

SUMMARY

Embodiments are for improving display quality by securing an aperture ratio while less reflective color bands generated as external light may be asymmetrically reflected even if a polarizing plate is not formed on the entire surface.

A light emitting display device according to an embodiment may include a substrate, pixel circuit parts positioned on the substrate, light emitting diodes (LED) electrically connected to pixel circuit parts, an encapsulation layer covering at least one of pixel circuit parts and at least one of light emitting diodes (LED), and a light blocking member positioned on the encapsulation layer and including a red opening, a blue opening, and a green opening. The red opening, the blue opening, and the green opening may have a mass center, a first position closest to the mass center, and a second position furthest from the mass center. In case that a ratio of a distance from the mass center to the second position to a distance from the mass center to the first position is referred to as a maximum minimum distance ratio, the red opening may have a value of about 1.02 or more and about 1.15 or less as the maximum minimum distance ratio, the blue opening may have a value of about 1.05 or more and about 1.2 or less as the maximum minimum distance ratio, and the green opening may have a value of about 1.32 or more and about 1.38 or less as the maximum minimum distance ratio.

The red opening, the blue opening, and the green opening may have a hybrid structure including a straight line and a curved line.

The light blocking member may include a plurality of openings formed of one red opening, one blue opening, and two green openings as a unit.

The two green openings may be long in different directions.

An angle formed by two directions in which the two green opening extends may be about 90 degrees.

The light emitting display device may further include color filters of different colors that may be positioned in the red opening, the blue opening, and the green opening.

The light emitting display device may further include a reflection adjustment layer filling the red opening, the blue opening, and the green opening and formed on the light blocking member may be further included.

The light emitting diodes (LEDs) may include a cathode, and the light emitting display device may further include a low reflection layer positioned between the cathode and the encapsulation layer.

The light emitting display device may further include a capping layer positioned between the cathode and the low reflection layer.

The light emitting display device may further include a low adhesive layer formed a part where the cathode may not be formed.

A manufacturing method of a light emitting display device according to an embodiment may include forming an initial opening in a light blocking member, applying a Gaussian filter to the initial opening and the light blocking member, and applying a threshold value to the initial opening and the light blocking member to which the Gaussian filter may be applied to form a final opening. The final opening may include a red opening, a blue opening, and a green opening, the Gaussian filter to form the red opening may have a full width at half maximum value of about 8 μm or more and about 12 μm or less, the Gaussian filter to form the blue opening may have a full width at half maximum of about 8 μm or more and about 14 μm or less, and the Gaussian filter to form the green opening may have a full width at half maximum of about 8 μm or more and about 10 μm or less.

The initial opening may only include a straight line and may not include a curved line.

The initial opening may have a quadrangle shape.

The final opening may be formed by a hybrid structure including a straight line and a curved line.

The red opening, the blue opening, and the green opening may have a mass center, a first position closest to the mass center, and a second position furthest from the mass center In case that a ratio of a distance from the mass center to the second position to a distance from the mass center to the first position is referred to as a maximum minimum distance ratio, the red opening may have a value of about 1.02 or more and about 1.15 or less as the maximum minimum distance ratio, the blue opening may have a value of about 1.05 or more and about 1.2 or less as the maximum minimum distance ratio, and the green opening may have a value of about 1.32 or more and about 1.38 or less as the maximum minimum distance ratio.

In the forming of the final opening, the threshold value may be about 50%, a value above the threshold value may be changed to a maximum gray, and a value below the threshold value may be changed to a minimum gray to form the final opening.

The full width at half maximum for forming the red opening, the full width at half maximum for forming the blue opening, and the full width at half maximum for forming the green opening may be different from each other.

In case that the full width at half maximum is small, it may be close to the initial opening, and in case that the full width at half maximum is large, the curved line component may increase.

The full width at half maximum for forming the blue opening may be the largest, the full width at half maximum for forming the red opening may be next largest, and the full width at half maximum for forming the green opening may be the smallest.

The full width at half maximum for forming the blue opening may be about 14 μm, the full width at half maximum for forming the red opening may be about 12 μm, and the full width at half maximum for forming the green opening may be about 10 μm.

According to embodiments, even if the polarizer is not formed on the entire surface, the opening formed in the light blocking member may be formed into a specific structure, so that the reflective color band may be less generated and the aperture ratio may be secured, thereby improving a display quality. For example, in case that the opening of the light blocking member is formed in a quadrangle, there may be a problem that the reflection color band may be largely generated, in the case of forming the opening of the light blocking member in a circular shape, although the reflective color band may be reduced, there may be a problem that the lifespan of the light emitting diode (LED) may be shortened as the aperture ratio may be reduced. However, as in the disclosure, the opening with a high ratio of the curved line part may be formed while having an intermediate structure of a circle and a quadrangle in the light blocking member, thereby the aperture ratio may be secured while the reflective color band may be reduced due to the high symmetry of the diffraction pattern, and the lifespan of the light emitting diode (LED) may be improved.

DETAILED DESCRIPTION OF THE EMBODIMENTS

Figure 1:
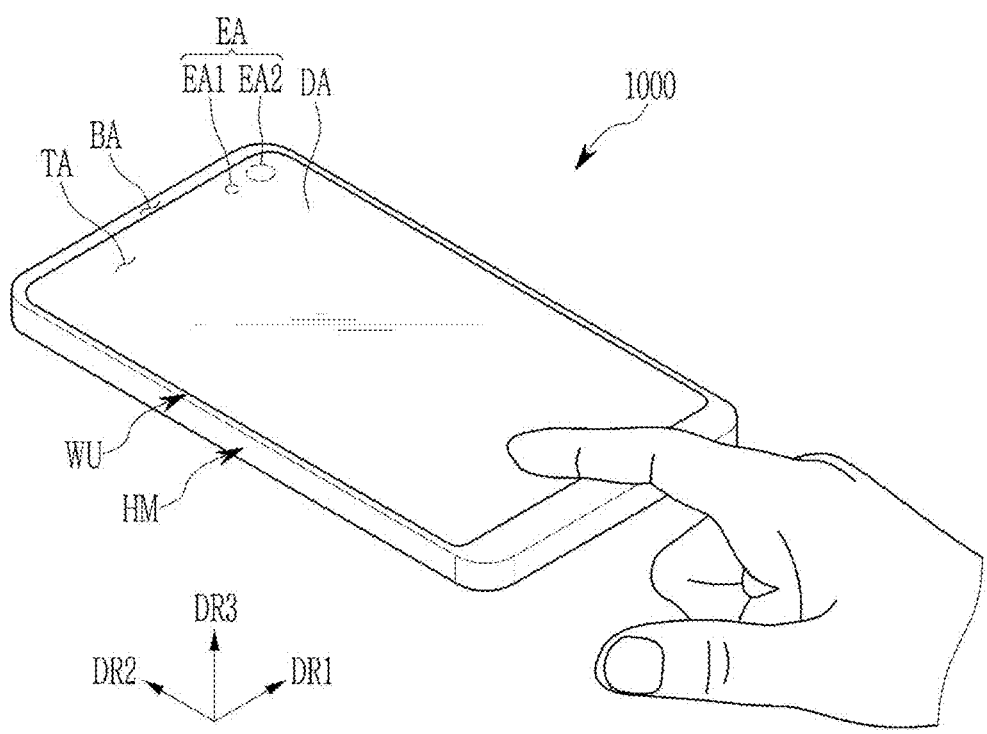
FIG. 1 is a schematic perspective view showing a use state of a display device according to an embodiment.

The disclosure will be described more fully hereinafter with reference to the accompanying drawings, in which embodiments of the disclosure are shown. As those skilled in the art would realize, the described embodiments may be modified in various different ways, all without departing from the spirit or scope of the disclosure.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean any combination including "A, B, or A and B." The terms "and" and "or" may be used in the conjunctive or disjunctive sense and may be understood to be equivalent to "and/or."

Descriptions of parts not as directly related to the disclosure may be omitted in the interest of brevity, and like reference numerals designate like elements throughout the specification.

Since sizes and thicknesses of constituent members shown in the accompanying drawings may be arbitrarily given for better understanding and ease of description, the disclosure is not limited to the illustrated sizes and thicknesses. In the drawings, the thickness of layers, films, panels, regions, etc., may be exaggerated for clarity.

It will be understood that when an element such as a layer, film, region, or substrate is referred to as being "on" another element, it can be directly on the other element or intervening elements may also be present. In contrast, when an element is referred to as being "directly on" another element, there may be no intervening elements present. Further, in the specification, the word "on" or "above" means positioned on or below the object portion, and does not necessarily mean positioned on the upper side of the object portion based on a gravitational direction.

The terms "comprises," "comprising," "includes," and/or "including,", "has," "have," and/or "having," and variations thereof when used in this application, specify the presence of stated features, integers, steps, operations, elements, components, and/or groups thereof, but do not preclude the presence or addition of one or more other features, integers, steps, operations, elements, components, and/or groups thereof.

Further, in the application, the phrase "plan view" means viewing the object portion from a top, and the phrase "cross-sectional view" means viewing a cross-section of which the object portion is vertically cut from a side.

Throughout the application, "connected" may not only mean that two or more constituent elements may be directly connected, but also where two or more constituent elements may be connected indirectly through other constituent elements. "Connected" may also include a case where substantially integral parts may be connected to each other even if they may be referred to by a different name depending on the position or function, as well as the case of being physically connected or electrically connected.

Throughout the application, when it is said that parts such as wires, layers, films, areas, plates, and constituent elements are "extended in a first direction or second direction", this does not mean only a straight-line shape extending straight in the corresponding direction, but also may include a structure that extends overall along the first direction or the second direction, a structure that may be bent and has a zigzag structure in a part, and a structure extending while including a curved line structure.

Electronic devices including display devices and display panels described in the application (e.g., mobile phones, TVs, monitors, laptop computers, etc.) or display devices and electronic devices including display panels, etc. manufactured by the manufacturing method described in the specification are not excluded from the range of applicability of this specification.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 2:
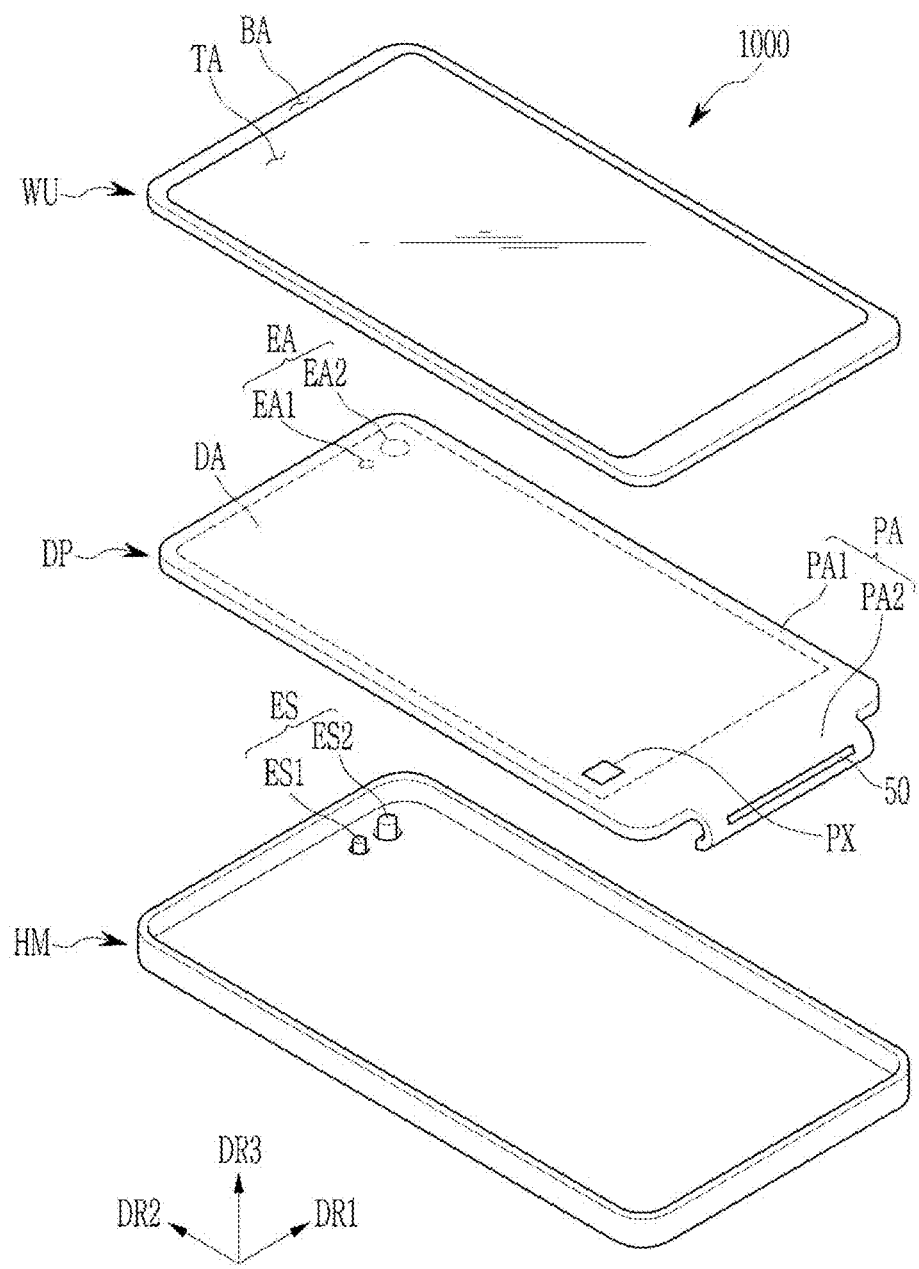
FIG. 2 is an exploded schematic perspective view of a display device according to an embodiment.
Figure 3:
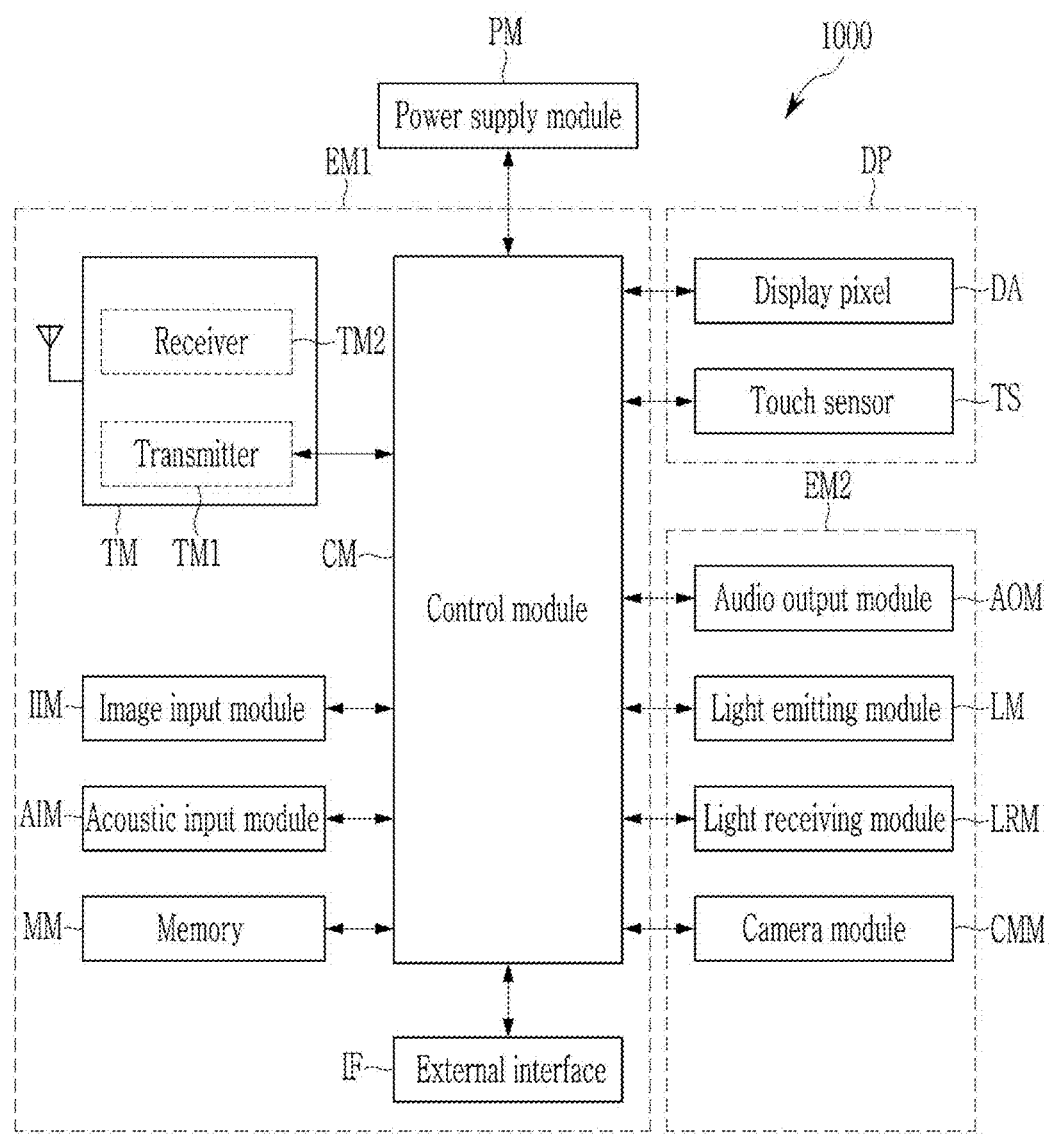
FIG. 3 is a schematic block diagram of a display device according to an embodiment.

Hereinafter, a schematic structure of a display device is described with reference to FIG. 1 to FIG. 3. FIG. 1 is a schematic perspective view showing a use state of a display device according to an embodiment, FIG. 2 is an exploded schematic perspective view of a display device according to an embodiment, and FIG. 3 is a schematic block diagram of a display device according to an embodiment.

Referring to FIG. 1, a display device 1000 according to an embodiment is a device for displaying a motion picture or a still image, and may be used as a display screen of various products such as a television, a laptop, a monitor, an advertisement board, an Internet of Things (IOT) device, etc. as well as portable electronic devices such as a mobile phone, a smart phone, a tablet personal computer, a mobile communication terminal, an electronic notebook, an e-book, a PMP (portable multimedia player), a navigation device, a UMPC (Ultra Mobile PC), etc. The display device 1000 according to an embodiment may be used in a wearable device such as a smart watch, a watch phone, a glasses display, and a head mounted display (HMD). The display device 1000 according to an embodiment may be used as an instrument panel of a car, and a center fascia of the car or a CID (Center Information Display) disposed on a dashboard, a room mirror display that replaces a side mirror of the car, an entertainment device for a rear seat of the car, or a display disposed on the rear surface of the front seat. FIG. 1 shows that the display device 1000 may be used as a smartphone for better comprehension and ease of description.

The display device 1000 may display an image in a third direction DR3 on a display surface parallel to each of a first direction DR1 and a second direction DR2. The display surface on which the image is displayed may correspond to the front surface of the display device 1000 and may correspond to the front surface of a cover window WU. The images may include static images as well as dynamic images.

In an embodiment, a front surface (or an upper surface) and a rear surface (or a lower surface) of each member are defined based on the direction in which the image may be displayed. The front surface and the rear surface may be opposed to each other in the third direction DR3, and the normal directions of each of the front and the rear surfaces may be parallel to the third direction DR3. The separation distance in the third direction DR3 between the front surface and the rear surface may correspond to the thickness in the third direction DR3 of the display panel.

The display device 1000 according to an embodiment may detect an input (referring to a hand in FIG. 1) of a user applied from the outside. The input of the user may include various types of external inputs such as a part of the user's body, light, heat, or pressure. In an embodiment, the user's input is shown with the user's hand applied to the front. However, the disclosure is not limited thereto. The user's input may be provided in various forms, and the display device 1000 may sense the user's input applied to the side surface or the rear surface of the display device 1000 according to the structure of the display device 1000.

Referring to FIG. 1 and FIG. 2, the display device 1000 may include a cover window WU, a housing HM, a display panel DP, and an optical element ES. In an embodiment, the cover window WU and the housing HM may be combined to constitute the appearance of the display device 1000.

The cover window WU may include an insulating panel. For example, the cover window WU may be made of glass, plastic, or a combination thereof.

The front surface of the cover window WU may define the front surface of the display device 1000. The transmissive area TA may be an optically transparent area. For example, the transmissive area TA may be an area having visible ray transmittance of about 90% or more.

The blocking area BA may define the shape of the transmissive area TA. The blocking area BA may be adjacent to the transmissive area TA and may surround the transmissive area TA. The blocking area BA may be an area having relatively low light transmittance compared to the transmissive area TA. The blocking area BA may include an opaque material that blocks light. The blocking area BA may have a predetermined or selectable color. The blocking area BA may be defined by a bezel layer provided separately from the transparent substrate defining the transmissive area TA, or may be defined by an ink layer formed by inserting or coloring it into the transparent substrate.

The display panel DP may include a display panel DP displaying an image and a driving unit 50. The display panel DP may include the front surface including a display area DA and a non-display area PA. The display area DA may be an area in which a pixel operates and emits light according to an electrical signal.

In an embodiment, the display area DA may be an area in which the image may be displayed including the pixel, and may be an area in which an external input may be sensed by simultaneously positioning a touch sensor on the upper side in the third direction DR3 of the pixel.

The transmissive area TA of the cover window WU may at least partially overlap the display area DA of the display panel DP. For example, the transmissive area TA may overlap the front surface of the display area DA or may overlap at least a portion of the display area DA. Accordingly, the user may recognize the image through the transmissive area TA or provide the external input based on the image. However, the disclosure is not limited thereto. For example, in the display area DA, an area in which the image may be displayed and an area in which the external input may be detected may be separated from each other.

The non-display area PA of the display panel DP may at least partially overlap the blocking area BA of the cover window WU. The non-display area PA may be an area covered by the blocking area BA. The non-display area PA may be adjacent to the display area DA and may surround the display area DA. The image may not be displayed in the non-display area PA, and a driving circuit or driving wiring for driving the display area DA may be disposed. The non-display area PA may include a first peripheral area PA1 positioned outside the display area DA and a second peripheral area PA2 including a driving part 50, connection wiring, and a bending area. In an embodiment of FIG. 2, the first peripheral area PA1 may be positioned on three sides of the display area DA, and the second peripheral area PA2 may be positioned on another side of the display area DA.

In an embodiment, the display panel DP may be assembled in a flat state in which the display area DA and the non-display area PA face the cover window WU. However, the disclosure is not limited thereto. Part of the non-display area PA of the display panel DP may be bent. The portion of the non-display area PA faces the rear surface of the display device 1000, so that the blocking area BA shown on the front surface of the display device 1000 may be reduced, and as shown in FIG. 2, the second peripheral area PA2 may be bent to be positioned on the rear surface of the display area DA, and assembled.

The display panel DP may include a component area EA, specifically, may include a first component area EA1 and a second component area EA2. The first component area EA1 and the second component area EA2 may be at least partially surrounded by the display area DA. Although the first component area EA1 and the second component area EA2 are shown to be spaced apart from each other, the disclosure is not limited thereto, and at least some of them may be connected. The first component area EA1 and the second component area EA2 may be areas in which a component using infrared rays, visible rays, and/or a sound may be disposed below the first component area EA1 and the second component area EA2.

The display area DA may include light emitting diodes (LEDs), and pixel circuit parts for generating and transmitting a light emitting current to each of the light emitting diodes (LEDs). Here, one light emitting diode LED and one pixel circuit part may be referred to as a pixel PX. In the display area DA, one pixel circuit part and one light emitting diode LED may be formed one-to-one.

The first component area EA1 may include an area composed of a transparent layer to allow light to pass through, a conductive layer or a semiconductor layer may not be positioned, and a pixel defining layer and a light blocking layer including a light blocking material include an opening overlapping the position corresponding to the first component area EA1, thereby having a structure that may not block light.

The second component area EA2 may include a transmissive part through which light and/or sound may pass and a display unit including pixels. The transmissive part may be positioned between the adjacent pixels and may be composed of a transparent layer through which light and/or sound may pass. The display unit may be formed to have one unit structure by adding multiple pixels, and the transmissive part may be positioned between the adjacent unit structures.

Referring to FIG. 3 in addition to FIG. 1 and FIG. 2, the display panel DP may include the display area DA including the display pixel, and the touch sensor TS. The display panel DP may be visually recognized by the user from the outside through the transmissive area TA including the pixel that generates the image. The touch sensor TS may be positioned on the pixel, and may detect the external input applied from the outside. The touch sensor TS may detect the external input provided to the cover window WU.

Again referring to FIG. 2, the second peripheral area PA2 may include a bending part. The display area DA and the first peripheral area PA1 may have a flat state substantially parallel to the plane defined by the first direction DR1 and the second direction DR2, and a side of the second peripheral area PA2 may extend from the flat state and have the flat state again after going through the bending part. As a result, at least a part of the second peripheral area PA2 may be bent and assembled to be positioned on the rear surface side of the display area DA. At least a portion of the second peripheral area PA2 may overlap the display area DA on a plane in case of being assembled, so that the blocking area BA of the display device 1000 may be reduced. However, the disclosure is not limited thereto. For example, the second peripheral area PA2 may not be bent.

The driving part 50 may be mounted on the second peripheral area PA2, and may be mounted on the bending part or positioned on one of both sides of the bending part. The driving part 50 may be provided in the form of a chip.

The driving part 50 may be electrically connected to the display area DA to transmit an electrical signal to the display area DA. For example, the driving part 50 may provide data signals to the pixels PX disposed in the display area DA. In other embodiments, the driving part 50 may include a touch driving circuit and may be electrically connected to the touch sensor TS disposed in the display area DA. The driving part 50 may be designed to include various circuits in addition to the above-described circuits or to provide various electrical signals to the display area DA.

A pad part may be positioned at the end of the second peripheral area PA2, and the display device 1000 may be electrically connected to a flexible printed circuit board (FPCB) including a driving chip by the pad part. Here, the driving chip positioned on the flexible printed circuit board may include various driving circuits for driving the display device 1000 or connectors for power supply. According to an embodiment, instead of the flexible printed circuit board, a rigid printed circuit board (PCB) may be used.

The optical element ES may be disposed under the display panel DP. The optical element ES may include a first optical element ES1 overlapping the first component area EA1 and a second optical element ES2 overlapping the second component area EA2.

The first optical element ES1 may be an electronic element using light or sound. For example, the first optical element ES1 may be a sensor that receives and uses light such as an infrared sensor, a sensor that outputs and senses light or sound to measure a distance or recognize a fingerprint, a small lamp that outputs light, or a speaker that outputs a sound, etc. Of course, in the case of the electronic element using light, light of various wavelength bands such as visible light, infrared light, and ultraviolet light may be used.

The second optical element ES2 may be at least one of a camera, an infrared camera (an IR camera), a dot projector, an infrared illuminator, and a time-of-flight sensor (a ToF sensor).

Referring to FIG. 3, the display device 1000 may include a display panel DP, a power supply module PM, a first electronic module EM1, and a second electronic module EM2. The display panel DP, the power supply module PM, the first electronic module EM1 and the second electronic module EM2 may be electrically connected to each other. In FIG. 3, the display pixel and the touch sensor TS positioned in the display area DA among the configurations of the display panel DP are shown as an example.

The power supply module PM may supply power required for the overall operation of the display device 1000. The power supply module PM may include a conventional battery module.

The first electronic module EM1 and the second electronic module EM2 may include various functional modules for operating the display device 1000. The first electronic module EM1 may be directly mounted on the motherboard electrically connected to the display panel DP, or mounted on a separate substrate and electrically connected to the motherboard through a connector (not shown).

The first electronic module EM1 may include a control module CM, a wireless communication module TM, an image input module TIM, an audio input module AIM, a memory MM, and an external interface IF. Some of the modules may not be mounted on the motherboard and may be electrically connected to the motherboard through a flexible printed circuit board connected thereto.

The control module CM may control the overall operation of the display device 1000. The control module CM may be a microprocessor. For example, the control module CM activates or deactivates the display panel DP. The control module CM may control other modules such as the image input module TIM or the audio input module AIM based on the touch signal received from the display panel DP.

The wireless communication module TM can transmit/receive a wireless signal with other terminals using a Bluetooth or Wi-Fi line. The wireless communication module TM may transmit/receive voice signals by using a general communication line. The wireless communication module TM may include a transmitter TM1 that modulates and transmits a signal to be transmitted, and a receiver TM2 that demodulates a received signal.

The image input module TIM may process the image signal to be converted into image data that may be displayed on the display panel DP. The audio input module AIM may receive an external sound signal by a microphone in a recording mode, a voice recognition mode, etc. to be converted into electrical voice data.

The external interface IF may serve as an interface connected to an external charger, a wired/wireless data port, or a card socket (e.g., a memory card, a SIM/UIM card).

The second electronic module EM2 may include an audio output module AOM, a light emitting module LM, a light receiving module LRM, and a camera module CMM, and at least some of these as the optical elements ES, as shown in FIG. 1 and FIG. 2, may be positioned on the rear surface of the display panel DP. The optical element ES may include a light emitting module LM, a light receiving module LRM, and a camera module CMM. The second electronic module EM2 may be directly mounted on the motherboard, mounted on a separate substrate and electrically connected to the display panel DP through a connector (not shown), or electrically connected to the first electronic module EM1.

The audio output module AOM may convert audio data received from the wireless communication module TM or audio data stored in the memory MM to be output to the outside.

The light emitting module LM may generate and output light. The light emitting module LM may output infrared light. For example, the light emitting module LM may include an LED element. For example, the light receiving module LRM may detect infrared rays. The light receiving module LRM may be activated in case that infrared rays above a predetermined or selectable level are detected. The light receiving module LRM may include a CMOS sensor. After the infrared rays generated by the light emitting module LM are output, they may be reflected by an external subject (e.g., a user's finger or a face), and the reflected infrared ray may be incident on the light receiving module LRM. The camera module CMM may take an external image.

In an embodiment, the optical element ES may additionally include a light sensor or a thermal sensor. The optical element ES may detect an external object received through the front surface or provide a sound signal such as voice through the front surface to the outside. The optical element ES may include multiple components, and it is not limited to any one embodiment.

Again referring to FIG. 2, the housing HM may be physically connected with the cover window WU. The cover window WU may be disposed in a front surface of the housing HM. The housing HM may be combined with the cover window WU to provide a predetermined or selectable accommodation space. The display panel DP and the optical element ES may be accommodated in a predetermined or selectable accommodation space provided between the housing HM and the cover window WU.

The housing HM may include a material with relatively high stiffness. For example, the housing HM may include frames and/or plates made of glass, plastic, or metal, or a combination thereof. The housing HM may reliably protect the components of the display device 1000 accommodated in the interior space from an external impact.

Figure 4:
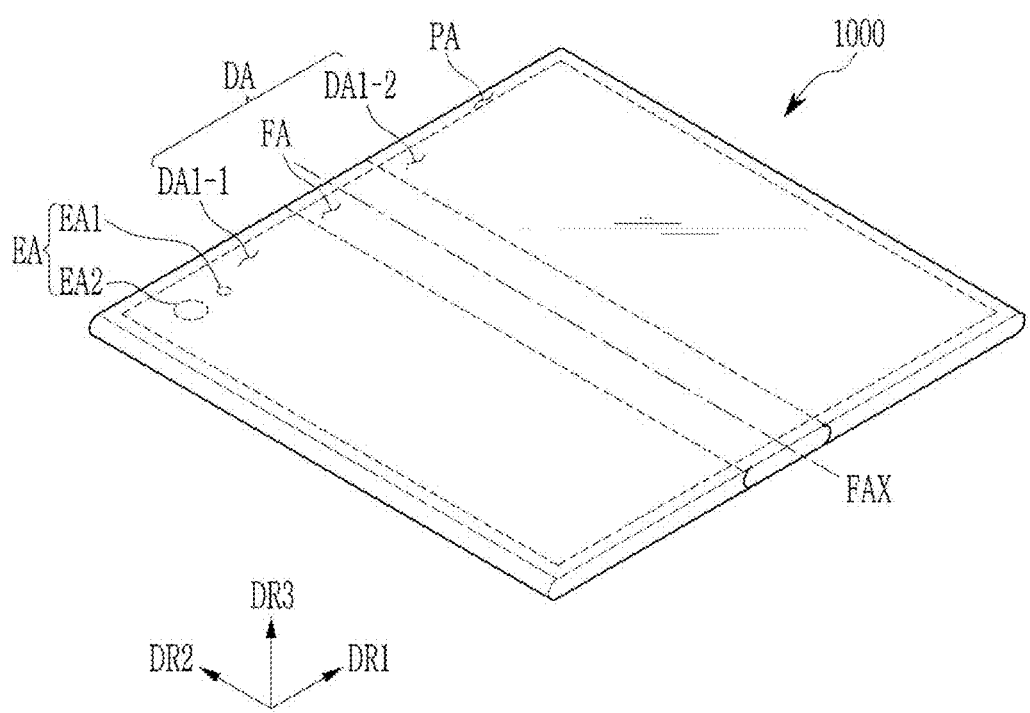
FIG. 4 is a schematic perspective view showing a use state of a light emitting display device according to an embodiment.

Hereinafter, the structure of the display device 1000 according to another embodiment is described with reference to FIG. 4. FIG. 4 is a schematic perspective view schematically showing a display device according to another embodiment. The description of the same configurations as the above-described constituent elements is omitted.

An embodiment of FIG. 4 shows a foldable display device of a structure in which the display device 1000 may be folded based on a folding line FAX.

Referring to FIG. 4, in an embodiment, the display device 1000 may be the foldable display device. The display device 1000 may be folded outward or inward based on the folding axis FAX. In case of being folded outward based on the folding axis FAX, the display surface of the display device 1000 may be positioned on the outside in the third direction DR3, so that the images may be displayed in both directions. In case of being folded inward based on the folding axis FAX, the display surface may not be visually recognized from the outside.

In an embodiment, the display device 1000 may include a display area DA, a component area EA, and a non-display area PA. The display area DA may be divided into a first/first display area DA1-1, a first/second display area DA1-2, and a folding area FA. The first/first display area DA1-1 and the first/second display area DA1-2 may be positioned on the left and right sides, respectively, based on (or at) the center of the folding axis FAX, and the folding area FA may be positioned between the first/first display area DA1-1 and the first/second display area DA1-2. In case of being folded outward based on the folding axis FAX, the first/first display area DA1-1 and the first/second display area DA1-2 are positioned on both sides in the third direction DR3, and the images may be displayed in both directions. In case of being folded inward based on the folding axis FAX, the first/first display area DA1-1 and the first/second display area DA1-2 may not be visually recognized from the outside.

Figure 5:
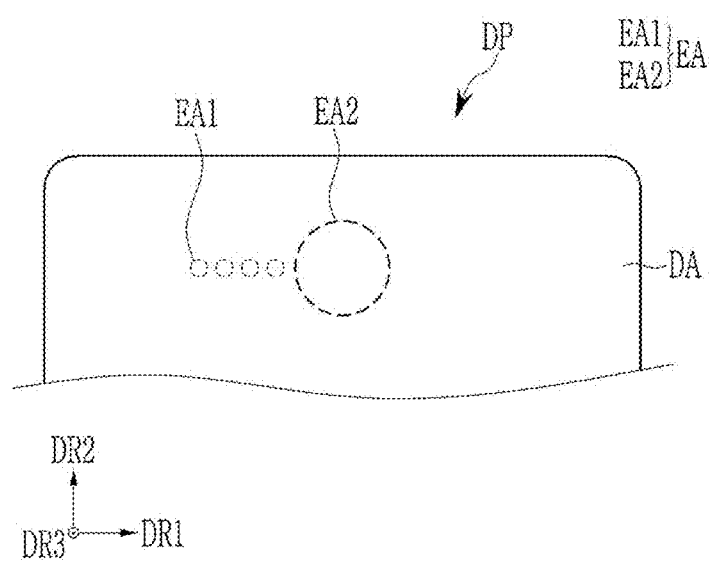
FIG. 5 is a schematic plan view enlarging a partial region of a light emitting display device according to an embodiment.

FIG. 5 is a schematic plan view enlarging and showing a partial area of a light emitting display device according to an embodiment.

FIG. 5 shows a part of the light emitting display panel DP among the light emitting display devices according to an embodiment and is illustrated using a display panel for a mobile phone.

The light emitting display panel DP may have a display area DA positioned on the front surface and may include a component area EA on the front surface, and specifically may include a first component area EA1 and a second component area EA2. In an embodiment of FIG. 5, the first component area EA1 may be positioned in the position adjacent to the second component area EA2. In an embodiment of FIG. 5, the first component area EA1 may be positioned to the left of the second component area EA2. The position and number of first component areas EA1 may vary for each embodiment. In FIG. 5, the optical element corresponding to the second component area EA2 may be a camera, and the optical element corresponding to the first component area EA1 may be an optical sensor.

Light emitting diodes (LEDs) and pixel circuit parts for generating and transmitting a light emitting current to each of the light emitting diodes (LEDs) may be formed in the display area DA. Here, one light emitting diode LED and one pixel circuit part are referred to as a pixel PX. In the display area DA, one pixel circuit part and one light emitting diode LED may be formed one-to-one. The display area DA is hereinafter also referred to as 'a normal display area'. In FIG. 5, the structure of the light emitting display panel DP under the cut line is not shown, but the display area DA may be positioned under the cut line.

The first component area EA1 may include a transparent layer to allow light to pass through, the transparent layer may not have a conductive layer or a semiconductor layer and may have a photosensor area in a lower panel layer, and in the pixel definition layer 380, the light blocking member 220 and the color filter layer 230 of the upper panel layer, an opening (hereinafter, also referred to as an additional opening) may be formed at a position corresponding to the photosensor area, thereby having a structure that may not block light. On the other hand, even if the photosensor area may be positioned in the lower panel layer, if there is no opening corresponding to the upper panel layer, it may be the display area DA rather than the first component area EA1.

The light emitting display panel DP according to an embodiment may be largely divided into a lower panel layer and an upper panel layer. The lower panel layer may be the part where the light emitting diode (LED) and the pixel circuit part constituting the pixel are positioned, and may include an encapsulation layer (referring to 400 of FIG. 7) covering them. For example, the lower panel layer may be from the substrate (referring to 110 in FIG. 7) to the encapsulation layer, also may include an anode, the pixel definition layer (referring to 380 in FIG. 7), an emission layer (referring to EML in FIG. 7), a spacer (referring to 385 in FIG. 7), a functional layer (referring to FL in FIG. 7), and a cathode (referring to Cathode in FIG. 7), and may include an insulating layer, a semiconductor layer, and a conductive layer between the substrate and the anode. On the other hand, the upper panel layer as a part positioned above the encapsulation layer may include a sensing insulating layer (referring to 501, 510, and 511 in FIG. 7) and sensing electrodes (referring to 540 and 541 of FIG. 7) that can sense the touch, and may include a light blocking member (referring to 220 of FIG. 7), a color filter (referring to 230 of FIG. 7), and a planarization layer (referring to 550 of FIG. 7).

Figure 7:
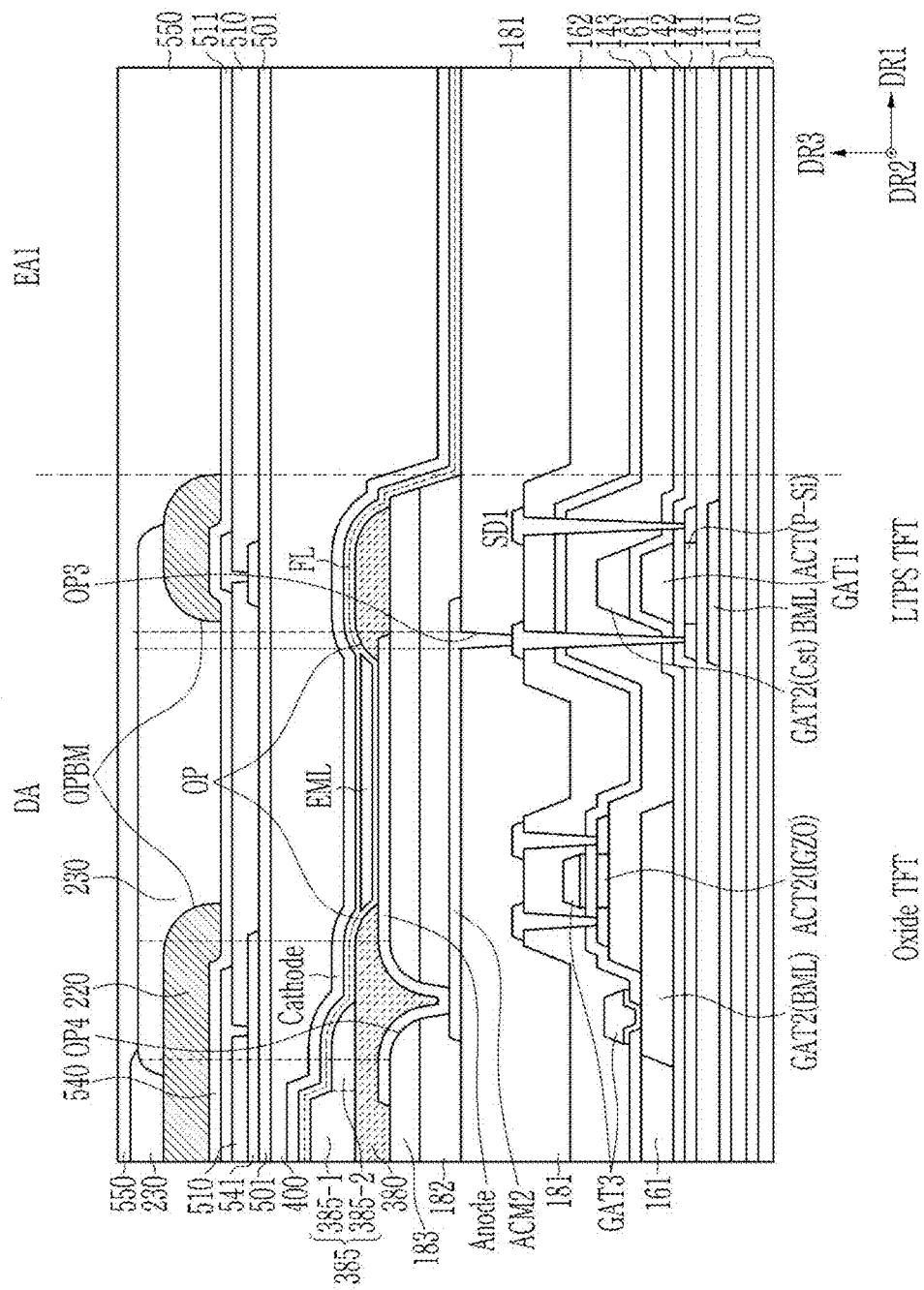
FIG. 7 is a schematic cross-sectional view of a light emitting display device according to an embodiment.

The structure of the lower panel layer of the display area DA is described based on FIG. 7.

Although not illustrated in FIG. 5, a peripheral area may be further positioned outside the display area DA. Also, FIG. 5 shows a display panel for a mobile phone, but an embodiment may be applied to other devices as long as an optical element can be positioned on the rear surface of the display panel, and it may also be applied to the flexible display device. In the case of the foldable display device among the flexible display devices, the positions of the second component area EA2 and the first component area EA1 may be formed in positions different from those shown in FIG. 5.

Hereinafter, the circuit structure of the pixel positioned on the lower panel layer of the light emitting display panel DP is described in detail with reference to FIG. 6.

The following pixel structure may be a pixel structure of the display area DA and/or the second component area EA2 including the photosensor area. Here, the photosensor area may be a part corresponding to the first component area EA1, and in case that light is blocked by the light blocking member or the like above the photosensor area, it may be included in the display area DA.

Figure 6:
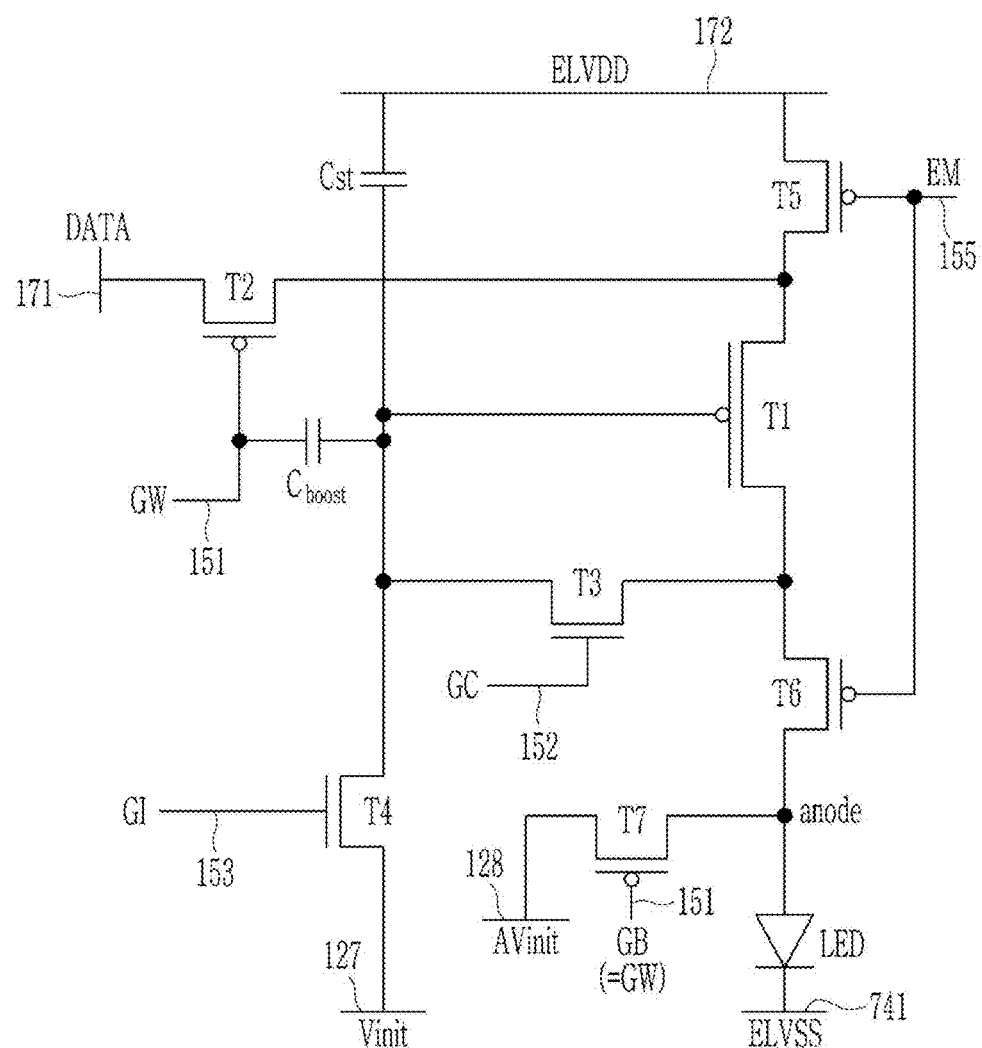
FIG. 6 is a schematic circuit diagram of a pixel included in a light emitting display device according to an embodiment.

FIG. 6 is a schematic circuit diagram of a pixel included a light emitting display device according to an embodiment.

A pixel according to an embodiment may include transistors T1, T2, T3, T4, T5, T6, and T7, a storage capacitor Cst, a boost capacitor $C_{boost}$, and a light emitting diode LED, which are connected to several wires 127, 128, 151, 152, 153, 155, 171, 172, and 741. Here, the transistors and the capacitors except for the light emitting diode LED constitute the pixel circuit part. According to an embodiment, the boost capacitor $C_{boost}$ may be omitted.

The wires 127, 128, 151, 152, 153, 155, 171, 172, and 741 may be connected to a pixel PX. The wires may include a first initialization voltage line 127, a second initialization voltage line 128, a first scan line 151, a second scan line 152, an initialization control line 153, a light emission control line 155, a data line 171, a driving voltage line 172, and a common voltage line 741. The first scan line 151 connected to the seventh transistor T7 may also be connected to the second transistor T2, but according to an embodiment, the seventh transistor T7 may be connected by a separate bypass control line unlike the second transistor T2.

The first scan line 151 may be connected to a scan driver (not shown) to transmit a first scan signal GW to the second transistor T2 and the seventh transistor T7. A voltage of an opposite polarity to the voltage applied to the first scan line 151 may be applied to the second scan line 152 at the same timing as the signal of the first scan line 151. For example, in case that a negative voltage is applied to the first scan line 151, a positive voltage may be applied to the second scan line 152. The second scan line 152 transmits a second scan signal GC to the third transistor T3. The initialization control line 153 may transmit an initialization control signal GI to the fourth transistor T4. The light emitting control line 155 may transmit the light emitting control signal EM to the fifth transistor T5 and the sixth transistor T6.

The data line 171 may be a wire that transmits a data voltage DATA generated by a data driver (not shown), and accordingly, the magnitude of the light emitting current transmitted to the light emitting diode LED changes, and thus the luminance of the light emitting diode LED changes. The driving voltage line 172 may apply a driving voltage ELVDD. The first initialization voltage line 127 may transmit a first initialization voltage Vinit, and the second initialization voltage line 128 may transmit a second initialization voltage AVinit. The common voltage line 741 may apply a common voltage ELVSS to the cathode of the light emitting diode LED. In an embodiment, the voltages applied to the driving voltage line 172, the first and second initialization voltage lines 127 and 128, and the common voltage line 741 may be constant voltages, respectively.

The driving transistor (T1; also called a first transistor) may be a p-type transistor and may have a silicon semiconductor as a semiconductor layer. It may be a transistor that adjusts the magnitude of the light emitting current output to the anode of the light emitting diode LED according to the magnitude of the voltage of the gate electrode of the driving transistor T1 (i.e., the voltage stored in the storage capacitor Cst). Since the brightness of the light emitting diode LED may be adjusted according to the magnitude of the light emitting current output to the anode of the light emitting diode LED, the light emitting luminance of the light emitting diode LED may be adjusted according to the data voltage DATA applied to the pixel. For this purpose, the first electrode of the driving transistor T1 may be disposed to receive the driving voltage ELVDD and may be connected to the driving voltage line 172 via the fifth transistor T5. The first electrode of the driving transistor T1 may also be connected to the second electrode of the second transistor T2 to receive the data voltage DATA. The second electrode of the driving transistor T1 may output the light emitting current to the light emitting diode LED and may be connected to the anode of the light emitting diode LED via the sixth transistor (T6; hereinafter referred to as an output control transistor). The second electrode of the driving transistor T1 may also be connected to the third transistor T3 and transmit the data voltage DATA applied to the first electrode to the third transistor T3. The gate electrode of the driving transistor T1 may be connected to one electrode (hereinafter, referred to as 'a second storage electrode') of the storage capacitor Cst. Accordingly, the voltage of the gate electrode of the driving transistor T1 may change according to the voltage stored in the storage capacitor Cst, and therefore, the light emitting current output by the driving transistor T1 may be changed. The storage capacitor Cst may serve to keep the voltage of the gate electrode of the driving transistor T1 constant for one frame. The gate electrode of the driving transistor T1 may also be connected to the third transistor T3 so that the data voltage DATA applied to the first electrode of the driving transistor T1 may be transmitted to the gate electrode of the driving transistor T1 through the third transistor T3. The gate electrode of the driving transistor T1 may also be connected to the fourth transistor T4 and may be initialized by receiving the first initialization voltage Vinit.

The second transistor T2 may be a p-type transistor and may have a silicon semiconductor as a semiconductor layer. The second transistor T2 may be a transistor that receives the data voltage DATA into the pixel. The gate electrode of the second transistor T2 may be connected to the first scan line 151 and one electrode (hereinafter, referred to as 'a lower boost electrode') of the boost capacitor Cboost. The first electrode of the second transistor T2 may be connected to the data line 171. The second electrode of the second transistor T2 may be connected to the first electrode of the driving transistor T1. In case that the second transistor T2 is turned on by a negative voltage among the first scan signals GW transmitted through the first scan line 151, the data voltage DATA transferred through the data line 171 may be transferred to the first electrode of the driving transistor T1, and finally the data voltage DATA may be transferred to the gate electrode of the driving transistor T1 and stored in the storage capacitor Cst.

The third transistor T3 may be an n-type transistor and may have an oxide semiconductor as a semiconductor layer. The third transistor T3 may electrically connect the second electrode of the driving transistor T1 and the gate electrode of the driving transistor T1. As a result, it may be a transistor that allows the data voltage DATA to be compensated by the threshold voltage of the driving transistor T1 and stored in the second storage electrode of the storage capacitor Cst. The gate electrode of the third transistor T3 may be connected to the second scan line 152, and the first electrode of the third transistor T3 may be connected to the second electrode of the driving transistor T1. The second electrode of the third transistor T3 may be connected to the second storage electrode of the storage capacitor Cst, the gate electrode of the driving transistor T1, and another electrode (hereinafter referred to as 'an upper boost electrode') of the boost capacitor Cboost. The third transistor T3 may be turned on by the positive voltage among the second scan signals GC received through the second scan line 152, thereby the gate electrode of the driving transistor T1 and the second electrode of the driving transistor T1 may be connected, and the voltage applied to the gate electrode of the driving transistor T1 may be transferred to the second storage electrode of the storage capacitor Cst and stored in the storage capacitor Cst. At this time, the voltage stored in the storage capacitor Cst may be stored in a state in which the voltage of the gate electrode of the driving transistor T1 in case that the driving transistor T1 is turned off may be stored so that the threshold voltage Vth of the driving transistor T1 may be compensated.

The fourth transistor T4 may be an n-type transistor and may be an oxide semiconductor as a semiconductor layer. The fourth transistor T4 may serve to initialize the gate electrode of the driving transistor T1 and the second storage electrode of the storage capacitor Cst. The gate electrode of the fourth transistor T4 may be connected to the initialization control line 153, and the first electrode of the fourth transistor T4 may be connected to the first initialization voltage line 127. The second electrode of the fourth transistor T4 may be connected to the second electrode of the third transistor T3, the second storage electrode of the storage capacitor Cst, the gate electrode of the driving transistor T1, and the upper boost electrode of the boost capacitor Cboost. The fourth transistor T4 may be turned on by the positive voltage of the initialization control signal GI received through the initialization control line 153, and, the first initialization voltage Vinit may be transmitted to the gate electrode of the driving transistor T1, the second storage electrode of the storage capacitor Cst, and the upper boost electrode of the boost capacitor Cboost to be initialized.

The fifth transistor T5 and the sixth transistor T6 may be p-type transistors and may have a silicon semiconductor as a semiconductor layer.

The fifth transistor T5 may serve to transfer a driving voltage ELVDD to the driving transistor T1. The gate electrode of the fifth transistor T5 may be connected to the light emitting control line 155, the first electrode of the fifth transistor T5 may be connected to the driving voltage line 172, and the second electrode of the fifth transistor T5 may be connected to the first electrode of the driving transistor T1.

The sixth transistor T6 may serve to transmit the light emitting current output from the driving transistor T1 to the light emitting diode LED. The gate electrode of the sixth transistor T6 may be connected to the light emitting control line 155, the first electrode of the sixth transistor T6 may be connected to the second electrode of the driving transistor T1, and the second electrode of the sixth transistor T6 may be connected to the anode of the light emitting diode LED.

The seventh transistor T7 may be a p-type or n-type transistor, and the semiconductor layer may have a silicon semiconductor or an oxide semiconductor. The seventh transistor T7 may serve to initialize the anode of the light emitting diode LED. The gate electrode of seventh transistor T7 may be connected to the first scan line 151, the first electrode of seventh transistor T7 may be connected to the anode of the light emitting diode LED, and the second electrode of seventh transistor T7 may be connected to the second initialization voltage line 128. In case that the seventh transistor T7 is turned on by the negative voltage of the first scan line 151, the second initialization voltage AVinit may be applied to the anode of the light emitting diode LED to be initialized. On the other hand, the gate electrode of the seventh transistor T7 may be connected to a separate bypass control line and may be controlled by a separate wiring from the first scan line 151. Also, according to an embodiment, the second initialization voltage line 128 to which the second initialization voltage AVinit may be applied may be the same as the first initialization voltage line 127 to which the first initialization voltage Vinit may be applied.

Although it has been described that a pixel PX includes seven transistors T1 to T7 and two capacitors (the storage capacitor Cst, the boost capacitor Cboost), the disclosure is not limited thereto. For example, the boost capacitor Cboost may be excluded depending on the embodiment. Although the third transistor T3 and the fourth transistor T4 are n-type transistors in an embodiment, only one of them may be formed as an n-type transistor or other transistors may be formed as an n-type transistor.

In the above, the circuit structure of the pixel formed in the display area DA was described through FIG. 6.

Hereinafter, the entire cross-section structure of the light emitting display device is briefly described with reference to FIG. 7.

FIG. 7 is a schematic cross-sectional view of a light emitting display device according to an embodiment.

In FIG. 7, in addition to the stacked structure of the display area DA, the stacked structure of the first component area EA1 is also shown.

The light emitting display device may be largely divided into a lower panel layer and an upper panel layer, and the lower panel layer may be the part where the light emitting diode LED and the pixel circuit part constituting the pixel may be positioned, and may include the encapsulation layer 400 covering them. Here, the pixel circuit part may include the second organic layer 182 and the third organic layer 183, and may mean the configuration below them, and the light emitting diode LED mean configurations positioned above the third organic layer 183 and located below the encapsulation layer 400. A structure positioned above the encapsulation layer 400 may correspond to the upper panel layer.

Referring to FIG. 7, a metal layer BML may be positioned on a substrate 110.

The substrate 110 may include a material that may not bend due to a rigid characteristic such as glass, or a flexible material that can be bent such as plastic or polyimide. In the case of the flexible substrate, as shown in FIG. 7, it may have a structure that a double-layered structure of polyimide and a barrier layer formed of an inorganic insulating material thereon may be formed.

The metal layer BML may be formed at a position overlapping the channel of the driving transistor T1 in plan view among the subsequent first semiconductor layer and is also referred to as a lower shielding layer. The metal layer BML may include a metal such as copper (Cu), molybdenum (Mo), aluminum (Al), titanium (Ti), or a metal alloy.

On the substrate 110 and the metal layer BML, a buffer layer 111 covering them may be positioned. The buffer layer 111 may serve to block the penetration of impurity elements into a first semiconductor layer ACT(P-Si), and may be an inorganic insulating layer including silicon oxide (SiOx) or silicon nitride (SiNx), acid silicon oxynitride (SiONx), etc., or a combination thereof.

The first semiconductor layer ACT (P-Si) formed of a silicon semiconductor (e.g., a polycrystalline semiconductor (P-Si)) may be positioned on the buffer layer 111. The first semiconductor layer ACT (P-Si) may include a channel of a polycrystalline transistor LTPS TFT including the driving transistor T1 and a first region and a second region positioned on both sides thereof. Here, the polycrystalline transistor LTPS TFT may include not only the driving transistor T1 but also a second transistor T2, a fifth transistor T5, a sixth transistor T6, and a seventh transistor T7. Both sides of the channel of the first semiconductor layer ACT (P-Si) may have a region having a conductive layer characteristic by a plasma treatment or a doping, so that it may serve as a first electrode and a second electrode of the transistor.

The first gate insulating layer 141 may be positioned on the first semiconductor layer ACT (P-Si). The first gate insulating layer 141 may be an inorganic insulating layer including a silicon oxide (SiOx), a silicon nitride (SiNx), a silicon oxynitride (SiONx), or the like.

A first gate conductive layer GAT1 including a gate electrode of the polycrystalline transistor LTPS TFT may be positioned on the first gate insulating layer 141

In the first gate conductive layer GAT1, a first scan line or a light emitting control line may be formed in addition to the gate electrode of the polycrystalline transistor LTPS TFT.

The first gate conductive layer may include a metal such as copper (Cu), molybdenum (Mo), aluminum (Al), or titanium (Ti) or a metal alloy, and may be configured as a single layer or multiple layers.

After forming the first gate conductive layer GAT1, a plasma treatment or a doping process may be performed to make the exposed region of the first semiconductor layer conductive. For example, the first semiconductor layer ACT (P-Si) covered by the first gate conductive layer GAT1 may not be conductive, and the portion of the first semiconductor layer ACT (P-Si) not covered by the first gate conductive layer GAT1 may have the same characteristic as the conductive layer.

A second gate insulating layer 142 may be positioned on the first gate conductive layer GAT1 and the first gate insulating layer 141. The second gate insulating layer 142 may be an inorganic insulating layer including a silicon oxide (SiOx), a silicon nitride (SiNx), a silicon oxynitride (SiONx), or the like.

On the second gate insulating layer 142, a second gate conductive layer GAT2 including one electrode GAT2 Cst of the storage capacitor Cst and the lower shielding layer GAT2 (BML) of the oxide transistor Oxide TFT may be positioned. The lower shielding layer GAT2 (BML) of the oxide transistor oxide TFT may be positioned below the channel of the oxide transistor oxide TFT, respectively, thereby serving to shield from optical or electromagnetic interference provided to the channel from the lower side. An electrode GAT2 Cst of the storage capacitor Cst may overlap the gate electrode GAT1 of the driving transistor T1 to form a storage capacitor Cst. According to an embodiment, the second gate conductive layer GAT2 may further include a scan line, a control line, or a voltage line. The second gate conductive layer GAT2 may include a metal or a metal alloy such as copper (Cu), molybdenum (Mo), aluminum (Al), or titanium (Ti), and may be configured as a single layer or multiple layers.

A first interlayer insulating layer 161 may be positioned on the second gate conductive layer GAT2. The first interlayer insulating layer 161 may include an inorganic insulating layer including a silicon oxide (SiOx), a silicon nitride (SiNx), a silicon oxynitride (SiOxNy), and the like, and an inorganic insulating material may be thickly formed according to an embodiment.

An oxide semiconductor layer ACT2 (IGZO) including the channel, the first region, and the second region of the oxide transistor oxide TFT may be positioned on the first interlayer insulating layer 161.

A third gate insulating layer 143 may be positioned on the oxide semiconductor layer ACT2 (IGZO). The third gate insulating layer 143 may be positioned on the entire surface on the oxide semiconductor layer ACT2 (IGZO) and the first interlayer insulating layer 161. The third gate insulating layer 143 may include an inorganic insulating layer including a silicon oxide (SiOx), a silicon nitride (SiNx), a silicon oxynitride (SiONx), or the like.

On the third gate insulating layer 143, a third gate conductive layer GAT3 including the gate electrode of the oxide transistor oxide TFT may be positioned. The gate electrode of the oxide transistor oxide TFT may overlap the channel. The third gate conductive layer GAT3 may further include a scan line or a control line. The third gate conductive layer GAT3 may include a metal or a metal alloy such as copper (Cu), molybdenum (Mo), aluminum (Al), or titanium (Ti), and may be configured as a single layer or multiple layers.

A second interlayer insulating layer 162 may be positioned on the third gate conductive layer GAT3. The second interlayer insulating layer 162 may have a single-layered or multi-layered structure. The second interlayer insulating layer 162 may include an inorganic insulating material such as silicon nitride (SiNx), silicon oxide (SiOx), or silicon oxide (SiOxNy), and may include an organic material according to an embodiment.

On the second interlayer insulating layer 162, a first data conductive layer SD1 including a connecting member that may be connected to the first region and the second region of each of the polycrystalline transistor LTPS TFT and the oxide transistor Oxide TFT may be positioned. The first data conductive layer SD1 may include a metal such as aluminum (Al), copper (Cu), molybdenum (Mo), titanium (Ti), or a metal alloy, and may be configured as a single layer or multiple layers.

A first organic layer 181 may be positioned on the first data conductive layer SD1. The first organic layer 181 may be an organic insulator including an organic material, and the organic material may include at least one material selected from a group consisting of polyimide, polyamide, acryl resin, benzocyclobutene, and phenol resin.

A second data conductive layer including an anode connecting member ACM2 may be positioned on the first organic layer 181. The first organic layer 181 may include an organic layer opening OP3. The second data conductive layer may include a data line or a driving voltage line. The second data conductive layer may include a metal or a metal alloy such as aluminum (Al), copper (Cu), molybdenum (Mo), or titanium (Ti), and may be configured as a single layer or multiple layers.

A second organic layer 182 and a third organic layer 183 may be positioned on the second data conductive layer, and an anode connection opening OP4 may be formed in the second organic layer 182 and the third organic layer 183. The anode connecting member ACM2 may be electrically connected to the anode Anode through the anode connection opening OP4. The second organic layer 182 and the third organic layer 183 may be organic insulators, and may include at least one material selected from the group consisting of polyimide, polyamide, acryl resin, benzocyclobutene, and phenol resin. According to an embodiment, the third organic layer 183 may be omitted.

On the anode Anode, the pixel definition layer 380 covering at least a part of the anode Anode while having an opening OP exposing the anode Anode may be positioned. The pixel definition layer 380 may be a black pixel definition layer formed of an organic material with a black color so that light applied from the outside may not be reflected back to the outside, and according to an embodiment, it may be formed of a transparent organic material. According to an embodiment, the black pixel definition layer 380 may include an organic material of a negative-type black color, and may include a black color pigment.

A spacer 385 (385-1, 385-2) may be positioned on the pixel definition layer 380. Unlike the pixel definition layer 380, the spacer 385 may be formed of a transparent organic insulating material. According to an embodiment, the spacer 385 may be formed of a positive-type transparent organic material.

On the anode Anode, the spacer 385, and the pixel definition layer 380, a functional layer FL and a cathode Cathode may be sequentially formed, and in the display area DA and the first component area EA1, the functional layer FL and the cathode Cathode may be positioned over the entire area. The emission layer EML may be positioned between the functional layers FL, and the emission layer EML may be positioned only within the opening OP of the pixel definition layer 380. Hereinafter, a combination of the functional layer FL and the emission layer EML may be referred to as an intermediate layer. The functional layer FL may include at least one of an auxiliary layer such as an electron injection layer, an electron transport layer, a hole transport layer, and a hole injection layer, the hole injection layer and the hole transport layer may be positioned under the emission layer EML, and the electron transport layer and the electron injection layer may be positioned on the emission layer EML.

An encapsulation layer 400 may be positioned on the cathode Cathode. The encapsulation layer 400 may include at least one inorganic layer and at least one organic layer, and according to an embodiment, may have a triple-layer structure including a first inorganic encapsulation layer, an organic encapsulation layer, and a second inorganic encapsulation layer. The encapsulation layer 400 may be for protecting the emission layer EML from moisture or oxygen that may be inflowed from the outside. According to an embodiment, the encapsulation layer 400 may include a structure in which an inorganic layer and an organic layer may be sequentially stacked on each other.

A sensing insulating layer 501, 510, and 511 and sensing electrodes 540 and 541 may be positioned on the encapsulation layer 400 for touch sensing. In an embodiment of FIG. 7, the touch may be sensed in a capacitive type using two sensing electrodes 540 and 541.

Specifically, the first sensing insulating layer 501 may be formed on the encapsulation layer 400, and sensing electrodes 540 and 541 may be formed thereon. Sensing electrodes 540 and 541 may be insulated via the second sensing insulating layer 510 interposed therebetween, and the portions may be electrically connected through the opening positioned on the sensing insulating layer 510. Here, the sensing electrodes 540 and 541 may include a metal or metal alloy such as aluminum (Al), copper (Cu), silver (Ag), gold (Au), molybdenum (Mo), titanium (Ti), tantalum (Ta), etc. or a combination thereof, and may be composed of a single layer or multiple layers. The third sensing insulating layer 511 may be formed on the sensing electrode 540.

The light blocking member 220 and the color filter layer 230 may be positioned on the sensing electrode 540 and the third sensing insulating layer 511.

The light blocking member 220 may be positioned so as to overlap the sensing electrodes 540 and 541 on a plane and positioned so as not to overlap the anode Anode on a plane. This may prevent the anode Anode capable of displaying the image from being covered by the light blocking member 220 and the sensing electrodes 540 and 541.

The color filter layer 230 may be positioned on the third sensing insulating layer 511 and the light blocking member 220. The color filter layer 230 may include a red color filter that transmits red light, a green color filter that transmits green light, and a blue color filter that transmits blue light. Each color filter layer 230 may be positioned so as to overlap the anode Anode of the light emitting diode LED on a plane. The light emitted from the emission layer EML may be emitted while passing through the color filter and being changed into the corresponding color.

The light blocking member 220 may be positioned between the color filter layers 230, respectively. According to an embodiment, the color filter layer 230 may be replaced with a color conversion layer, or may further include a color conversion layer. The color conversion layer may include quantum dots. Also, according to an embodiment, a reflection adjustment layer filling the opening OPBM of the light blocking member 220 may be positioned instead of the color filter layer 230. The reflection adjustment layer may have a structure covering the light blocking member 220, and this is described with reference to FIG. 28.

A planarization layer 550 covering the color filter layer 230 may be positioned on the color filter layer 230. In an embodiment, a polarizer may not be attached on the planarization layer 550. For example, the polarizer may be attached to prevent an external light from being reflected. In an embodiment, the opening OPBM of the light blocking member 220 may be formed in a specific structure to reduce the problem of a reflection color band in which the external light may be asymmetrically reflected, so that there may be no need to include the polarizer On the other hand, FIG. 7 also shows the cross-section structure of the first component area EA1.

The first component area EA1 may be a region in which the photosensor area may be positioned on the lower panel layer, and may mean a region in which the pixel definition layer 380, the light blocking member 220, and the color filter layer 230 may not be formed.

The first component area EA1 may include only a transparent layer to allow light to pass through, there may be no conductive layer or semiconductor layer positioned, and the pixel definition layer 380, the light blocking member 220, and the color filter layer 230 may have an opening (hereinafter, also referred to as an additional opening) formed at the position corresponding to the photosensor area, thereby having a structure that may not block light.

Specifically, the stacked structure of the first component area EA1 according to an embodiment is described based on FIG. 7 as follows.

A buffer layer 111, which may be an inorganic insulating layer, may be positioned on the substrate 110, and a first gate insulating layer 141 and a second gate insulating layer 142, which may be inorganic insulating layers, may be sequentially positioned thereon. On the second gate insulating layer 142, the first interlayer insulating layer 161, the third gate insulating layer 143, and the second interlayer insulating layer 162, which may be inorganic insulating layers, may be sequentially stacked on each other. Among the organic insulators, only the first organic layer 181 may be stacked on the second interlayer insulating layer 162. However, according to an embodiment, the second organic layer 182 and/or the third organic layer 183 may be stacked on the first organic layer 181. According to an embodiment, only one or two organic layers may be formed among the organic insulators of the first organic layer 181, the second organic layer 182, and the third organic layer 183. The functional layer FL may be positioned on the third organic layer 183, and the cathode Cathode may be positioned on it. The stacked structure from the substrate 110 to the cathode Cathode so far may correspond to the photosensor area.

The encapsulation layer 400 may be positioned on the cathode Cathode, and the sensing insulating layers 501, 510, and 511 may be sequentially positioned thereon. The encapsulation layer 400 may have a triple layer structure including a first inorganic encapsulation layer, an organic encapsulation layer, and a second inorganic encapsulation layer. The sensing insulating layers 501, 510, and 511 may all be inorganic insulating layers.

The additional opening of the light blocking member 220 and the color filter layer 230 may be respectively positioned on the third sensing insulating layer 511, and the light blocking member 220 and the color filter layer 230 may not be formed on the first component area EA1. Since the additional opening may also be positioned in the pixel definition layer 380, the pixel definition layer 380 may not be formed in the first component area EA1.

In the first component area EA1, the planarization layer 550 may be positioned on the third sensing insulating layer 511.

In the first component area EA1 and the photosensor area, the metal layer BML, the first semiconductor layer ACT1, the first gate conductive layer GAT1, the second gate conductive layer GAT2, the oxide semiconductor layer ACT2, the third gate conductive layer GAT3, the first data conductive layer SD1, the second data conductive layer, and the anode Anode may not be positioned. Also, the emission layer EML and the sensing electrodes 540 and 541 may not be formed.

In the first component area EA1 and the photosensor area, the additional opening may be formed in the pixel definition layer 380, the light blocking member 220, and the color filter layer 230 so that the pixel definition layer 380, the light blocking member 220, and the color filter layer 230 may not be formed. However, the light blocking member 220 may be positioned if there is no problem in sensing even if the light blocking member 220 is positioned on the entire surface as the used photosensor uses a wavelength (e.g., infrared) other than that of visible rays.

In the above, an embodiment in which a total of three organic layers may be formed, and the anode connection opening may be formed in the second organic layer and the third organic layer has been described. However, the organic layer may be formed of at least two, the anode connection opening may be positioned in the upper organic layer positioned away from the substrate, and the lower organic layer opening may be positioned in the lower organic layer.

In the above, the overall structure of the light emitting display device and the pixel was described in detail.

Hereinafter, a detailed structure of the opening OPBM of the light blocking member 220 is described.

The opening OPBM of the light blocking member 220 may not be formed in a quadrangle, a circular or an oval shape, but may be formed in a planar structure including a curved line and a straight line (hereinafter, also referred to as a hybrid structure), and the red opening OPBM, the blue opening OPBM, and the green opening OPBM may be characterized by specific numerical ranges while being formed into different shapes as follows.

In the red opening OPBM of the light blocking member 220, the distance ratio Rmax/Rmin of the distance to the farthest side for the distance to the nearest side from the mass center may have a value of about 1.02 or more and about 1.15 or less, in the blue opening OPBM of the light blocking member 220, the distance ratio Rmax/Rmin may have a value of about 1.05 or more and about 1.2 or less, and in the green opening OPBM of the light blocking member 220, the distance ratio Rmax/Rmin may have a value of about 1.32 or more and about 1.38 or less.

By forming the opening OPBM of the light blocking member 220 having the above structure, the reflective color band may be reduced and the aperture ratio may be secured so that the lifespan of the light emitting diode (LED) may be improved.

Hereinafter, specifically, the structure of the red opening OPBM, the blue opening OPBM, and the green opening OPBM and the diffraction pattern thereof according to an embodiment are described with reference to FIG. 8 and FIG. 9.

Figure 8:
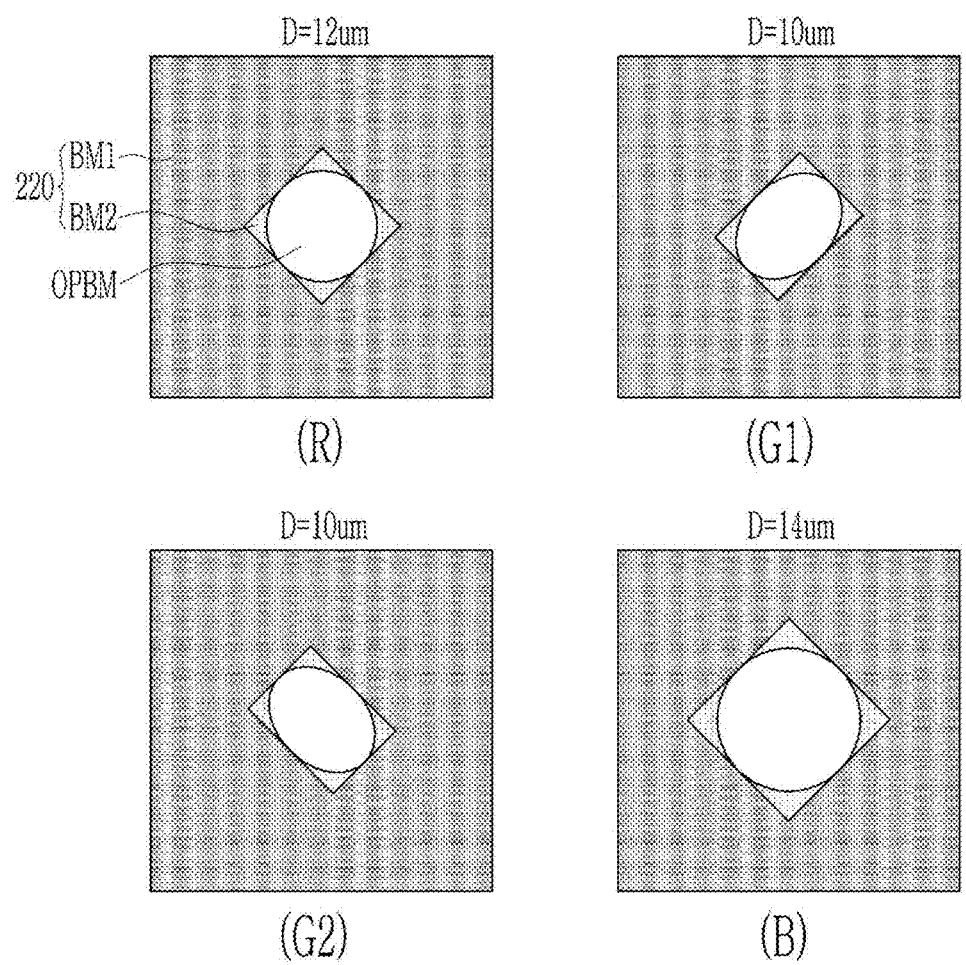
FIG. 8 is a schematic plan view showing an opening of a light blocking member of a red pixel, a blue pixel, and a green pixel among a light emitting display device according to an embodiment.

First, the structures of the red opening OPBM, the blue opening OPBM, and the green opening OPBM are described through FIG. 8.

FIG. 8 is a schematic plan view showing an opening of a light blocking member of a red pixel, a blue pixel, and a green pixel among a light emitting display device according to an embodiment.

In FIG. 8, R represents the red opening OPBM formed in the light blocking member 220, G1 and G2 represent two structures of the green opening OPBM formed in the light blocking member 220, and B represents the blue opening OPBM formed in the light blocking member 220.

In FIG. 8, the red opening OPBM, the blue opening OPBM, and the green opening OPBM have a structure (a hybrid structure) that may include not only a curved line but also a straight line component.

In FIG. 8, the light blocking member 220 is shown divided into two parts BM1 and BM2, the first light blocking part BM1 has an initial opening (referring to FIG. 10) with a quadrangle shape, and the second light blocking part BM2 may be a part positioned inside the initial opening having the quadrangle shape to additionally block light and constitutes a final opening (OPBM; referring to FIG. 10) having a hybrid structure together with the first light blocking part BM1, In FIG. 8, the first light blocking part BM1 and the second light blocking part BM2 are shown in the different colors so that they may be readily distinguished.

FIG. 8 shows D, D represents a full width at half maximum and indicates a full width at half maximum of a Gaussian filter to be used in FIG. 10 described later. This is discussed in more detail in FIG. 10 to FIG. 26. Referring to FIG. 8, the red opening OPBM, the blue opening OPBM, and the green opening OPBM may be formed using Gaussian filters having different full widths at half maximum.

The red opening OPBM may use the Gaussian filter of the full width at half maximum D of about 12 μm, the blue opening OPBM may use the Gaussian filter of the full width at half maximum D of about 14 μm, and the green opening OPBM may use the Gaussian filter of the full width at half maximum D of about 10 μm, thereby the Gaussian filter having the different full widths at half maximum D may be used. Also, the full width at half maximum D of the blue opening OPBM may have the largest value, the full width at half maximum D of the red opening OPBM may have the next largest value, and the full width at half maximum D of the green opening OPBM may have the smallest value.

The light blocking member 220 of the light emitting display device may have multiple openings OPBMs formed as a unit of one red opening OPBM, one blue opening OPBM, and two green openings OPBM, and of these, two green openings OPBM may be formed to be elongated in different directions, respectively, and the angle formed by two directions in which two green openings OPBM extend may be about 90 degrees.

Figure 9:
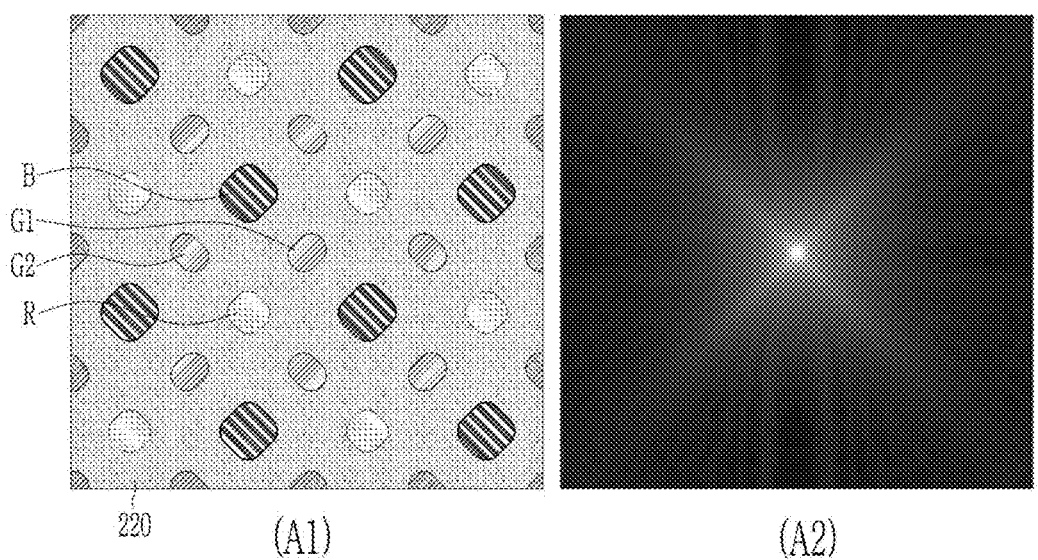
FIG. 9 is a schematic view showing a result of simulating a flat structure and a diffraction pattern of a light emitting display device according to an embodiment of FIG. 8.

The flat structure and the simulated diffraction pattern of this light blocking member 220 are described through FIG. 9.

FIG. 9 is a schematic view showing a result of simulating a flat structure and a diffraction pattern of a light emitting display device according to an embodiment of FIG. 8.

In FIG. 9, A1 represents the arrangement of the red opening OPBM, the blue opening OPBM, and the green opening OPBM formed in the light blocking member 220, and A2 represents the result simulating the diffraction pattern in the red opening OPBM or the blue opening OPBM that may be one opening OPBM among them.

First, referring to FIG. 9, A1 represents the structure in which one red opening OPBM, one blue opening OPBM, and two green opening OPBM are positioned adjacent to each other. Also, in FIG. 9, the pixel R, the pixel B, the pixel G1, and the pixel G2 are shown, the pixel R corresponding to the structure R of FIG. 8, the pixel B of the plane shape corresponding to the structure B of FIG. 8, the pixel G1 of the plane shape corresponding to the structure G1 of FIG. 8, and the pixel G2 of the plane shape corresponding to the structure G2 of FIG. 8 are shown, respectively.

The opening OPBM of the light blocking member 220 according to this embodiment may have the hybrid structure including the curved line and the straight line, and may include less straight line components, as shown in A2 of FIG. 9, the diffraction pattern may be formed symmetrically. Since the diffraction pattern may be formed symmetrically, in case that external light is incident, the degree of asymmetrical reflection may be small, so that the reflection color band phenomenon may also be small.

The method of forming the opening OPBM with the hybrid structure including the curved line and the straight line as described above is described in detail with reference to FIG. 10 and FIG. 11.

Figure 10:
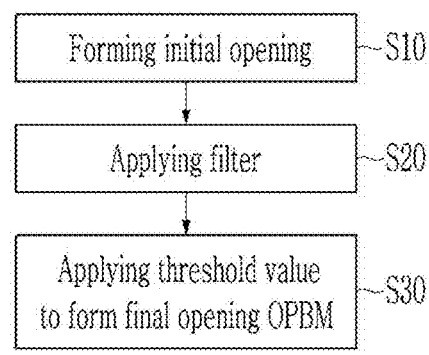
FIG. 10 is a schematic flowchart for a manufacturing method of a light emitting display device according to an embodiment.
Figure 11:
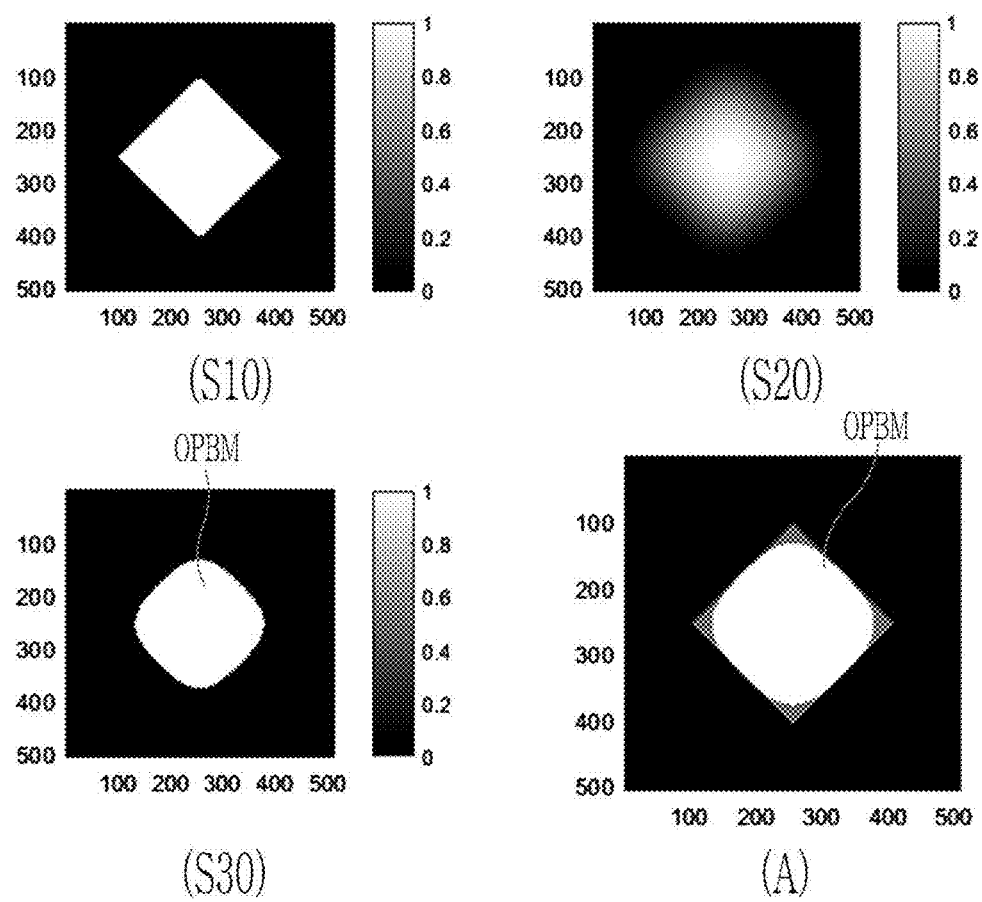
FIG. 11 is a schematic view showing a change in a structure of an opening of a light blocking member according to a manufacturing method of FIG. 10 and a difference between an initial opening and a final opening.

FIG. 10 is a schematic flowchart for a manufacturing method of a light emitting display device according to an embodiment, and FIG. 11 is a schematic view showing a change in a structure of an opening of a light blocking member according to a manufacturing method of FIG. 10 and a difference between an initial opening and a final opening.

In FIG. 10, a step (S10) corresponds to a view S10 of FIG. 11, and if a step (S20) of FIG. 10 is performed, it may be changed into a view S20 of FIG. 11, while if a step (S30) of FIG. 10 is performed, it may be changed into a view S30 of FIG. 11. Also, in FIG. 11, A is a view showing a comparison between the initial opening of the step (S10) and the final opening performed up to the step (S30). In S10, S20, and S30 of 11, 100, 200, 300, 400, and 500 written along an x-axis and a y-axis show sizes of the x-axis and the y-axis as a μm value. A reference graph positioned to the right indicates a normalized value of a maximum value (white) of 1 and a minimum value (black color) of 0 for a gray value shown in the drawing.

In the light emitting display device, the structure of the initial opening that may include only a straight line and may not have a curved line on the light blocking member 220 may be set and formed (S10). In an embodiment of FIG. 11, as shown in the view S10 of FIG. 11, a rhombus structure of a type of a quadrangle may be predetermined or selectable as the initial opening.

After that, a Gaussian filter may be applied to the predetermined or selectable angular initial opening and the light blocking member (S20). As shown in the view S20 of FIG. 11, the structure of the initial opening, which was composed of only white and black colors, may be changed to various grays.

After that, a threshold value may be applied to the initial opening to which the Gaussian filter may be applied to form a final opening OPBM (S30). Here, the used threshold value may be about 50%, based on the gray value of about 0.5 on the graph on the right, a value over about 0.5 may be changed to the maximum gray (white), and a value less than about 0.5 may be changed to the minimum gray (black) to form the final opening OPBM.

The view A of FIG. 11 is a drawing comparing the initial opening and the final opening, and the portion where the final opening may be formed smaller than the initial opening is shown in gray. Also, as confirmed in FIG. 11, the final opening OPBM may be changed to the hybrid structure by including more curved lines from the initial opening.

The final opening OPBM may include the red opening OPBM, the blue opening OPBM, and the green opening OPBM, and each may have different sizes and/or shapes.

Depending on the embodiment and/or depending on the used color, the Gaussian filter may be different, and the applied threshold value may also be different. For the threshold value in the step (S30), a value other than about 50% may be used, and a value of about 40% or more and about 60% or less may be used.

Figure 12:
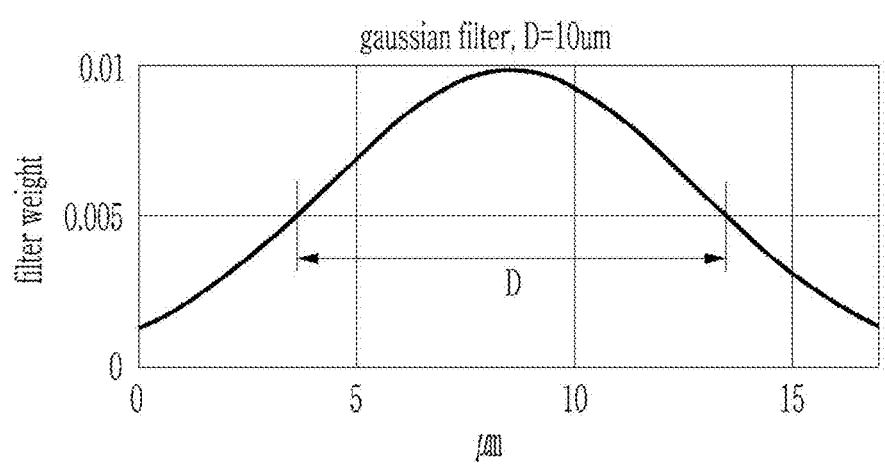
FIG. 12 and FIG. 13 are schematic graphs showing a structure of a Gaussian filter to which the disclosure may be applied.
Figure 13:
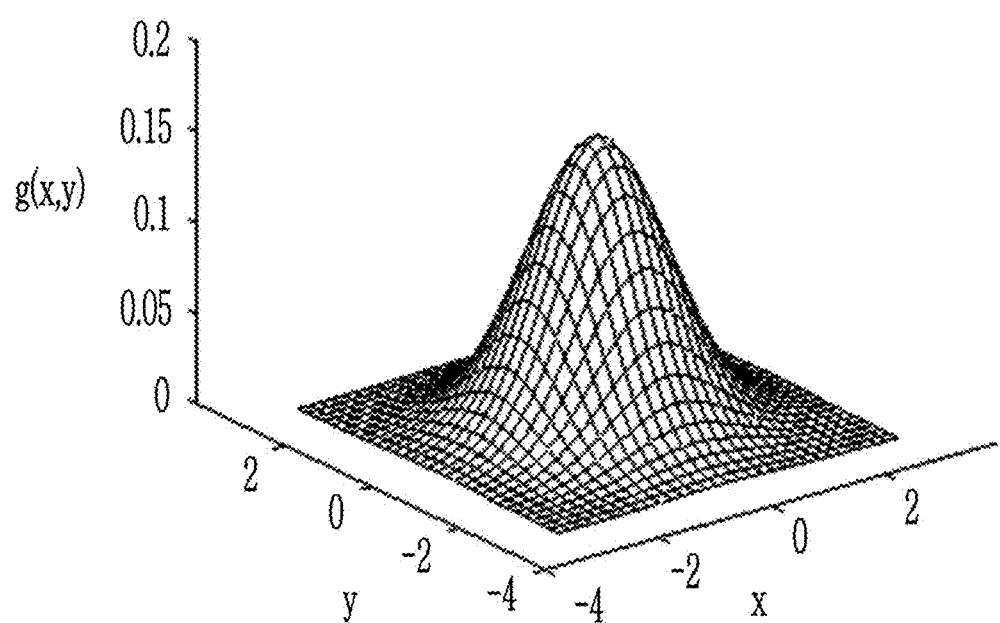

The size of the Gaussian filter may be determined according to the full width at half maximum D, and the Gaussian filter and the full width at half maximum D are described through FIG. 12 and FIG. 13.

FIG. 12 and FIG. 13 are schematic graphs showing a structure of a Gaussian filter to which the disclosure may be applied.

FIG. 12 shows a Gaussian filter value (a filter weight) along one axis direction of the Gaussian filter, and FIG. 13 shows a graph of a Gaussian function g(x, y) along the x-axis and y-axis.

Referring to FIG. 12, the full width at half maximum D may be clearly shown. The full width at half maximum D represents the width in case that the value of the Gaussian function and may have a half value of about 0.005 based on the maximum value of about 0.01, and FIG. 12 shows the Gaussian filter with the full width at half maximum D of about 10 μm.

In an embodiment, the different Gaussian filters may be used depending on the color, based on the full width at half maximum D, the full width at half maximum D of the blue opening OPBM may have the largest value, the full width at half maximum D of the red opening OPBM may have the next largest value, and the full width at half maximum D may have the smallest value.

The Gaussian filter for forming the red opening OPBM may have the value of about 8 μm or more and about 12 μm or less as the full width at half maximum D, the Gaussian filter for forming the blue opening OPBM may have the value of about 8 μm or more and about 14 μm or less as the full width at half maximum D, and the Gaussian filter for forming the green opening OPBM may have the value of about 8 μm or more and about 10 μm or less as the full width at half maximum D. Here, the minimum value of the full width at half maximum D may be about 8 μm, and the maximum value may be different according to each color. The maximum value of the full width at half maximum D may have a larger value by about 10% depending on the embodiment.

Hereinafter, the final opening OPBM of the light blocking member 220 may be formed according to each full width at half maximum D and the differences thereof are compared as follows through FIG. 14 to FIG. 20.

FIG. 14 to FIG. 20 are schematic views showing an opening of a light blocking member manufactured by using a Gaussian filter having full widths at half maximum that may be different from each other and a diffraction pattern according thereto.

In FIG. 14 to FIG. 20, R represents the red opening OPBM, and G1 and G2 represent the green opening OPBM, B represents the blue opening OPBM, A1 represents the structure of each opening arranged in the light blocking member 220, and A2 shows the simulated diffraction pattern.

In case that the Gaussian filter with the small value of the full width at half maximum D is applied, the final opening OPBM may be formed close to the shape of the initial opening, as the value of the full width at half maximum D increases, the curved line component increases so that it may be formed close to a circle or ellipse form.

Figure 14:
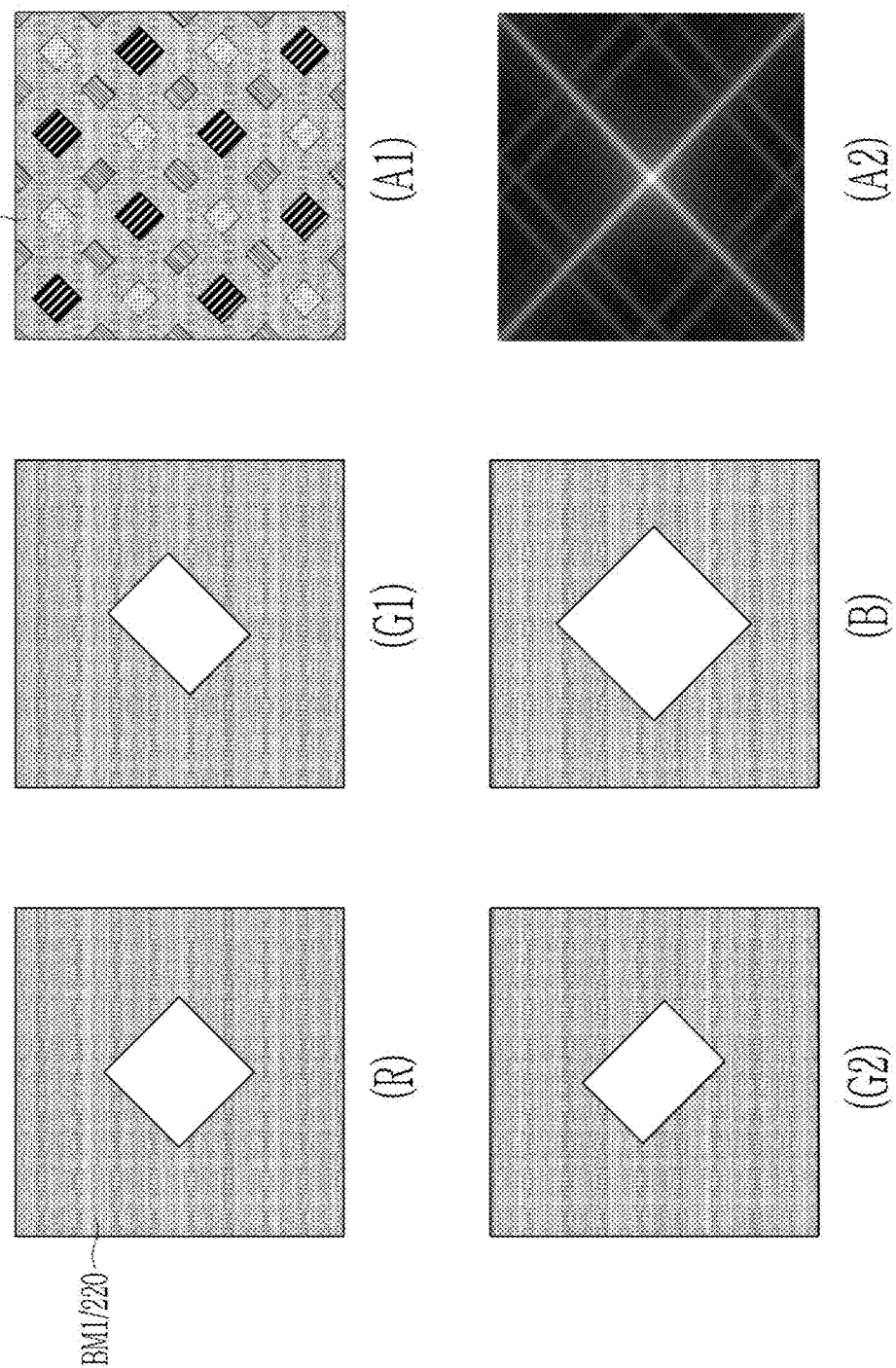
FIG. 14 to FIG. 20 are schematic views showing an opening of a light blocking member manufactured by using a Gaussian filter having full widths at half maximum that may be different from each other and a diffraction pattern according thereto.
Figure 15:
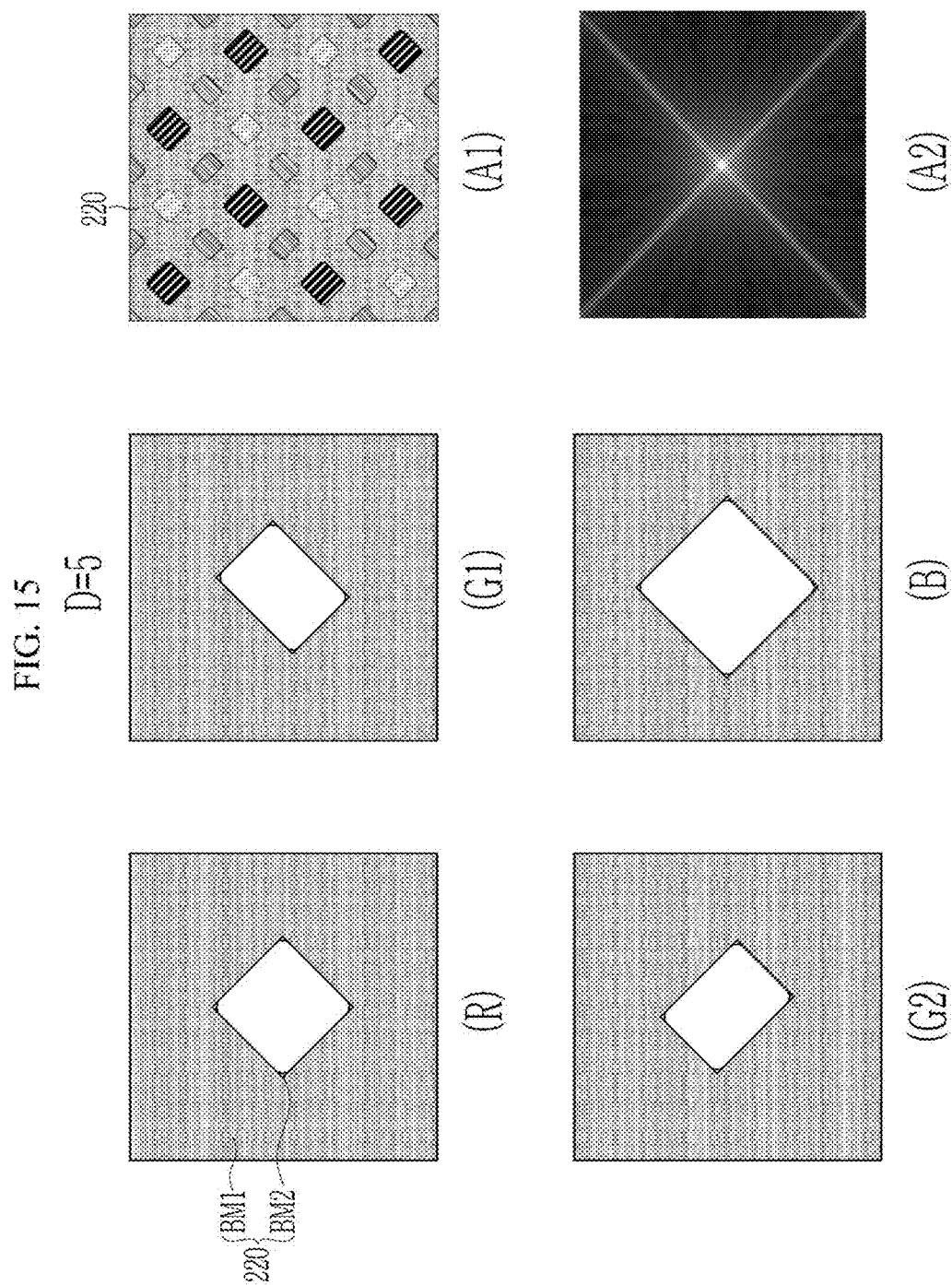

In FIG. 14, the full width at half maximum D value may be 0, so the initial opening and final opening OPBM may be the same. Referring to A2 of FIG. 14, since the diffraction pattern may be largely asymmetrical, the reflection color band may be large, but the initial opening may not be reduced and the final opening OPBM may be formed, so the aperture ratio may be the largest, and in case that the aperture ratio is large, the life of the light emitting diode (LED) may be long.

However, in an embodiment, since the polarizer may not be attached to the front of the light emitting display device, it may be difficult to use it as it may be due to the reflective color band.

In FIG. 15 to FIG. 20, the part that may be reduced while changing from the initial opening to the final opening OPBM is shown as the second light blocking part BM2. Also, from FIG. 15 towards FIG. 20, as the value of the full width at half maximum D increases, the area of the second light blocking part BM2 also increases, so that the area of the final opening OPBM may be reduced and the aperture ratio of the light blocking member 220 may also be reduced. As a result, there may be a problem that the lifespan of the light emitting diode (LED) may be shortened. Instead, from FIG. 15 toward FIG. 20, referring to A2 of each drawing, it may be confirmed that the symmetry of the diffraction pattern increases, and as a result the reflection color band decreases.

Therefore, as the full width at half maximum D increases, merits and drawbacks may occur together, and considering the merits and drawbacks, an appropriate value of the full width at half maximum D may be selected and used according to each color and the light emitting material used for the light emitting diode (LED).

Figure 16:
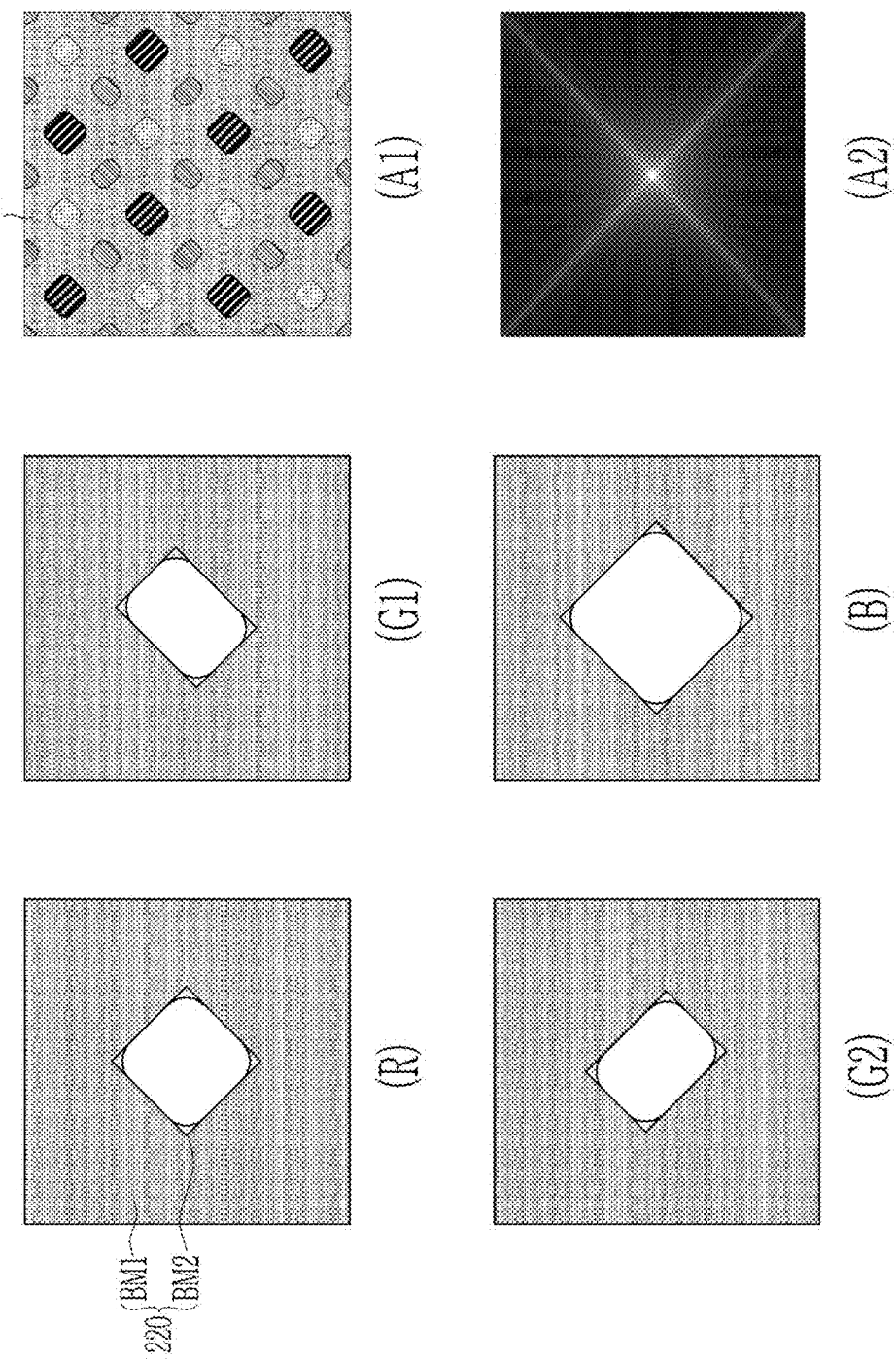

FIG. 16 shows a case where the full width at half maximum D may be about 8 μm, and referring to A2 of FIG. 16, since the symmetry of the diffraction pattern may be recognized over a certain level, the value of the full width at half maximum D of each color may be at least about 8 μm or more.

Although the initial opening of the green opening OPBM has a rectangular shape, the symmetry of the diffraction pattern may be required by adding two green openings OPBM arranged at about 90 degrees, so that the symmetry of the diffraction pattern in one green opening OPBM may be relatively low. As a result, the full width at half maximum D of the green opening OPBM may have the maximum value of about 10 μm.

In contrast, since only one red opening OPBM and one blue opening OPBM may be formed, the symmetry of the diffraction pattern may be relatively higher than that of the green opening OPBM. Considering that the blue opening OPBM may be formed relatively larger than the red opening OPBM, the full width at half maximum D of the red opening OPBM may have the maximum value of about 12 μm, and the full width at half maximum D of the blue opening OPBM may have the maximum value of about 14 μm.

Taken together, the Gaussian filter for forming the red opening OPBM may have the full width at half maximum D of about 8 μm or more and about 12 μm or less, may have the full width at half maximum D value of about 8 μm or more and about 14 μm or less for the blue opening OPBM, and may have the full width at half maximum D value of about 8 μm or more and about 10 μm or less for the green opening OPBM. Here, the minimum value of the full width at half maximum D may be about 8 μm, and the maximum value may be different according to each color. The maximum value of the full width at half maximum D may have a larger value by about 10% depending on an embodiment.

Hereinafter, the characteristics of the opening OPBM of the light blocking member 220 manufactured according to the various full widths at half maximum D through the manufacturing method of FIG. 10 are described with reference to FIG. 21 to FIG. 27 based on a mass center CM and a distance to the side therefrom.

Figure 24:
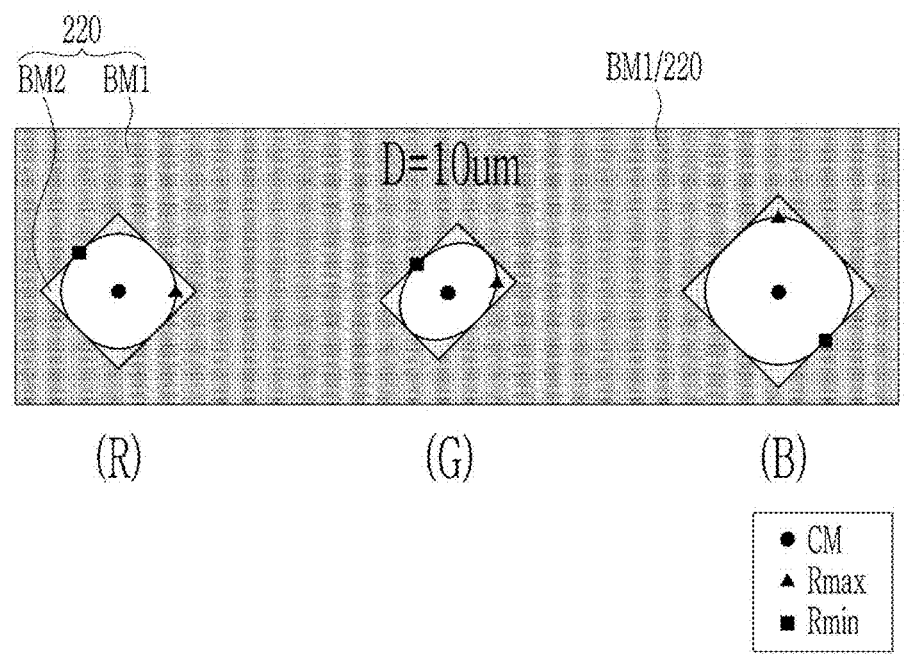
Figure 25:
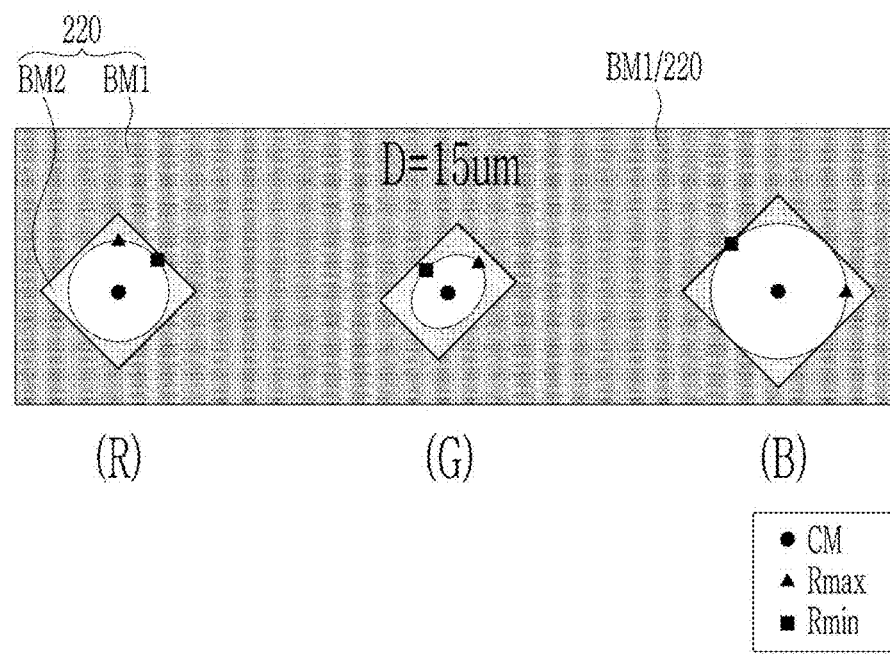
Figure 26:
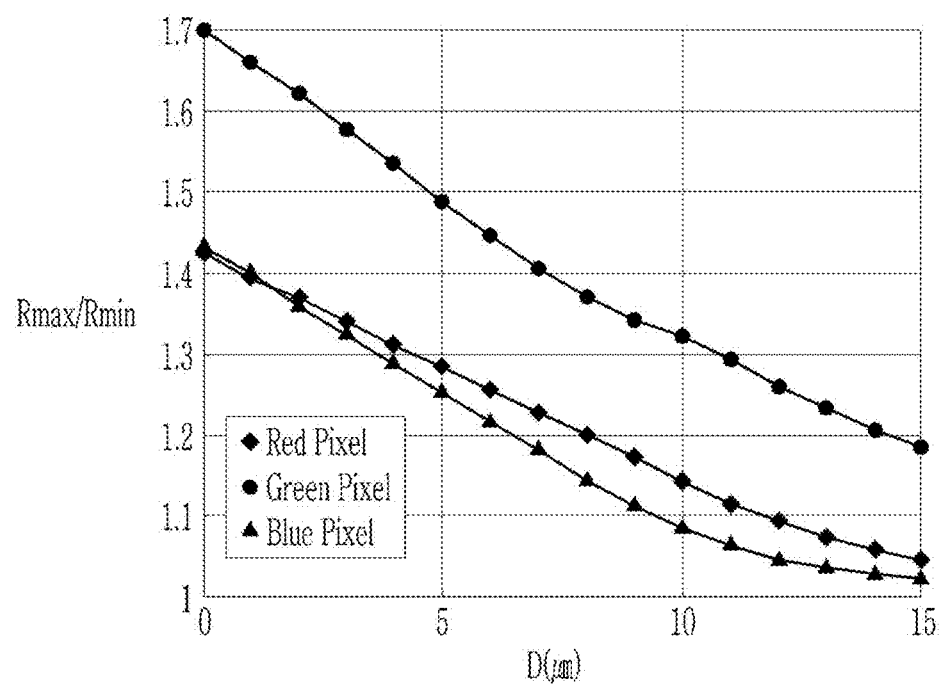
FIG. 26 is a schematic graph showing a ratio of a distance to a furthest point for a distance to a nearest point from a mass center based on a full width at half maximum.
Figure 27:
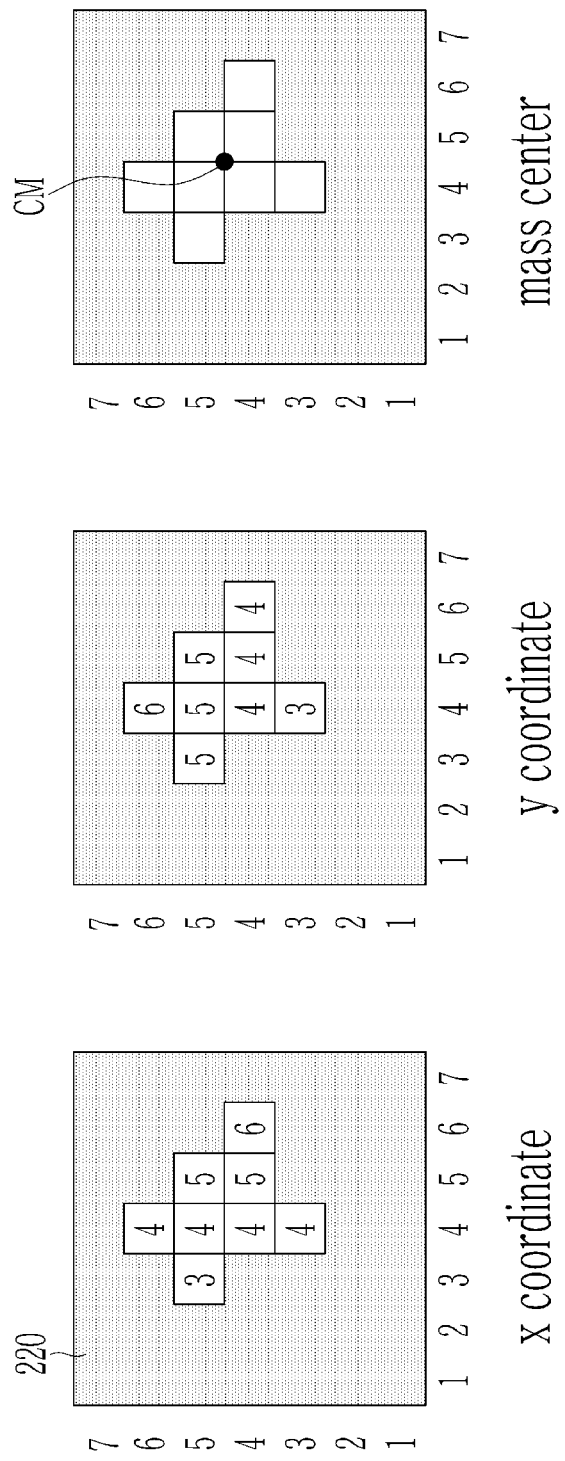
FIG. 27 is a schematic view showing a method of calculating each mass center by dividing an x coordinate and a y coordinate.

FIG. 21 to FIG. 25 are schematic views showing a mass center, a point closest to the mass center, and a point farthest from the mass center in an opening of a light blocking member manufactured by using a Gaussian filter having full widths at half maximum that may be different from each other, FIG. 26 is a schematic graph showing a ratio of a distance to a furthest point for a distance to a nearest point from a mass center based on a full width at half maximum value, and FIG. 27 is a schematic view showing a method of calculating each mass center by dividing an x coordinate and a y coordinate.

In FIG. 21 to FIG. 25, the red opening OPBM, the green opening OPBM, and the blue opening OPBM are indicated by R, G, and B, respectively, within each opening OPBM, the mass center CM, the point having the longest distance Rmax among the distances from the mass center CM to the boundary of the opening OPBM, and the point having the shortest distance Rmin among the distances from the mass center CM to the boundary of the opening OPBM are respectively indicated.

Figure 21:
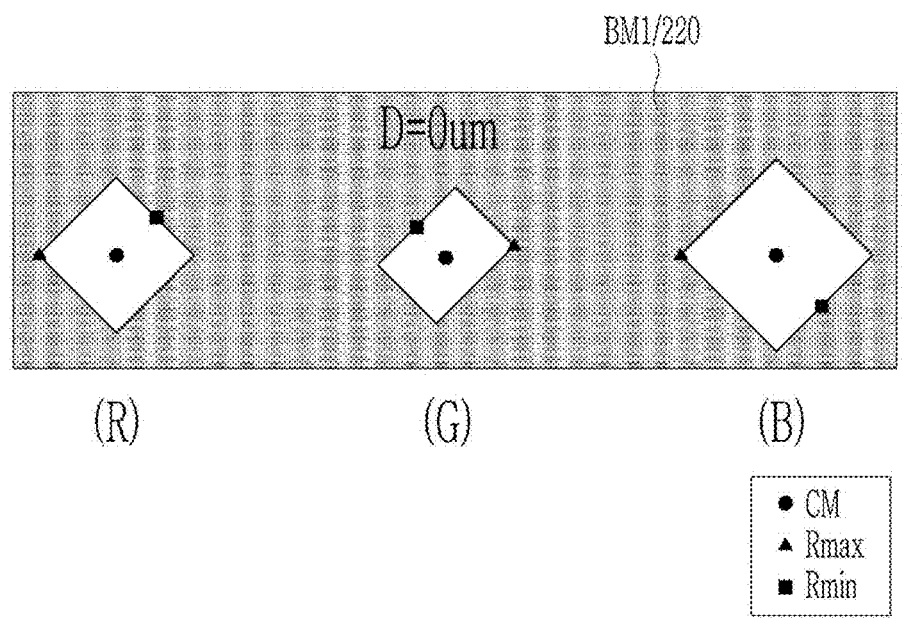
FIG. 21 to FIG. 25 are schematic views showing a mass center, a point closest to the mass center, and a point farthest from the mass center in an opening of a light blocking member manufactured by using a Gaussian filter having full widths at half maximum that may be different from each other.
Figure 22:
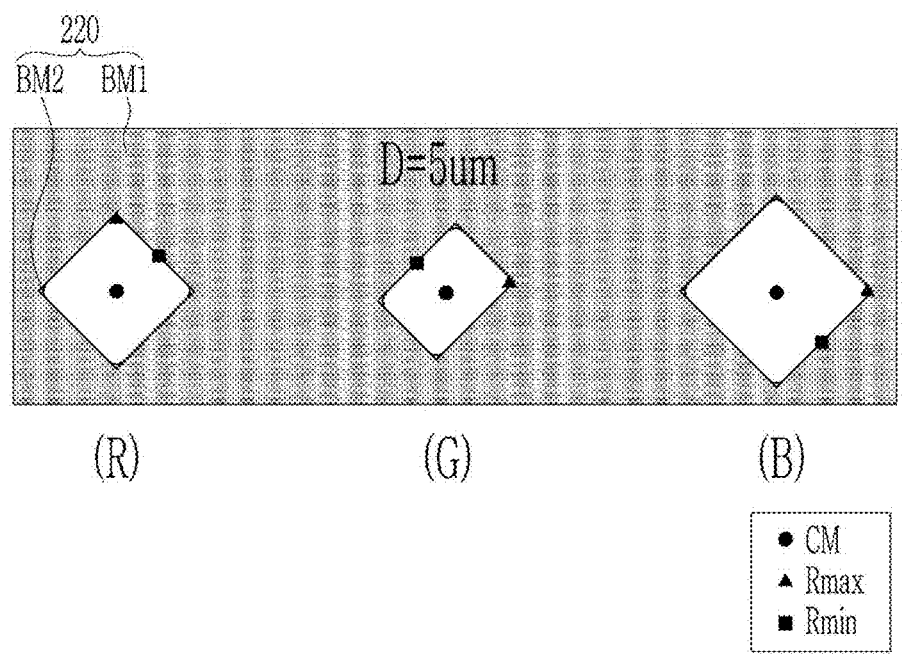
Figure 23:
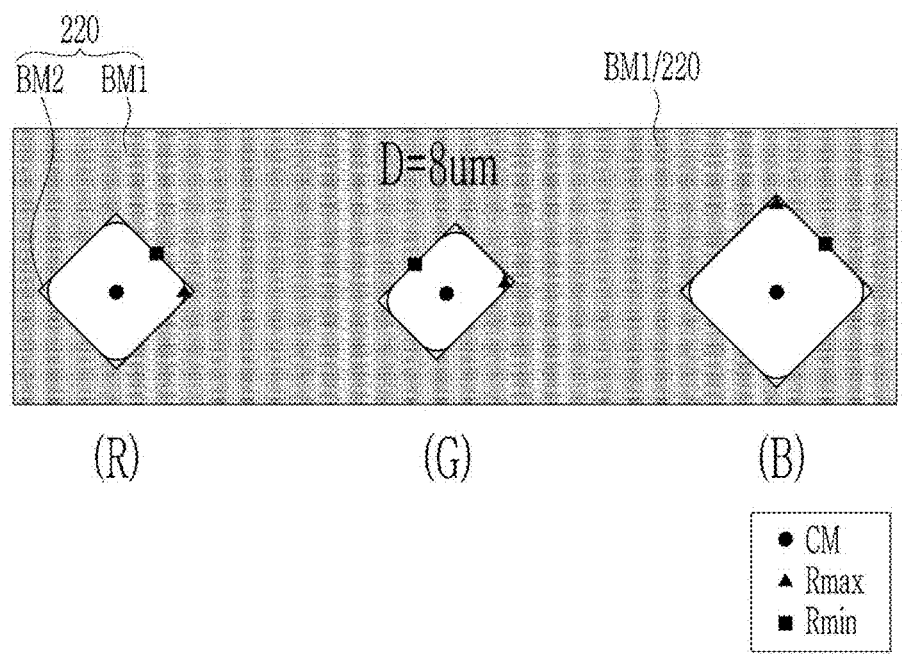

FIG. 21 shows the opening OPBM of which the full width at half maximum D is about 0 μm, FIG. 22 shows the opening OPBM of which the full width at half maximum D is about 5 μm, FIG. 23 shows the opening OPBM of which the full width at half maximum D is about 8 μm, FIG. 24 shows the opening OPBM of which the full width at half maximum D is about 10 μm, and FIG. 25 shows the opening OPBM of which the full width at half maximum D is about 15 μm.

FIG. 26, as shown in FIG. 21 to FIG. 25, shows a maximum minimum distance ratio Rmax/Rmin in the mass center CM according to the full width at half maximum D as a graph. The maximum minimum distance ratio Rmax/Rmin in the mass center CM may be a value that the distance to the point having the longest distance (Rmax) the distances from the mass center CM to the boundary of the opening OPBM may be divided by the distance to the point having the shortest distance (Rmin) among the distances from the mass center CM to the boundary of the opening OPBM. Also, FIG. 26 shows the maximum minimum distance ratio Rmax/Rmin in the mass center CM according to the full width at half maximum D for each of the red opening OPBM, the green opening OPBM, and the blue opening OPBM as a graph.

While referring to FIG. 26, in considering the full width at half maximum D value used for the opening OPBM of each color described in FIG. 10 to FIG. 20, a range of the maximum minimum distance ratio Rmax/Rmin in the mass center CM may be obtained as follows.

For example, the red opening OPBM of the light blocking member 220 may have the maximum minimum distance ratio Rmax/Rmin of about 1.02 or more and about 1.15 or less in the mass center CM, the blue opening OPBM of the light blocking member 220 may have the maximum minimum distance ratio Rmax/Rmin of about 1.05 or more and about 1.2 or less in the mass center CM, and the green opening OPBM of the light blocking member 220 may have the maximum minimum distance ratio Rmax/Rmin of about 1.32 or more and about 1.38 or less in the mass center CM.

For example, the red opening OPBM, the blue opening OPBM, and the green opening OPBM have the mass center CM, the first position closest to the mass center CM, and the second position farthest from the mass center CM, in case that the ratio of the distance Rmax from the mass center CM to the second position to the distance Rmin from the mass center CM to the first position is referred to as the maximum minimum distance ratio Rmax/Rmin, the red opening OPBM may have the maximum minimum distance ratio Rmax/Rmin of about 1.02 or more and about 1.15 or less, the blue opening OPBM may have the maximum minimum distance ratio Rmax/Rmin of about 1.05 or more and about 1.2 or less, and the green opening OPBM may have the maximum minimum distance ratio Rmax/Rmin of about 1.32 or more and about 1.38 or less.

The maximum minimum distance ratio Rmax/Rmin in the mass center CM may have the largest value in the green opening OPBM, the next largest value in the blue opening OPBM, and the smallest value in the red opening OPBM.

By forming the opening OPBM of the light blocking member 220 of the structure as described above, the reflective color band may be reduced and the aperture ratio may be secured, so that the lifespan of the light emitting diode (LED) may be improved.

On the other hand, in FIG. 27, a method capable of obtaining the mass center CM even the case having a complex structure is shown, and the method of obtaining the center for the x and y coordinates, respectively, and finally confirming the x and y coordinates of the mass center CM is shown. In FIG. 27, the number positioned in the square represents the x-coordinate value or the y-coordinate value, respectively.

In the above, as shown in FIG. 7, an embodiment in which the color filter 230 may be formed in the opening OPBM of the light blocking member 220 was described. More specifically, a red color filter, a blue color filter, and a green color filter may be formed in the red opening OPBM, the blue opening OPBM, and the green opening OPBM of the light blocking member 220, respectively. However, a reflection adjustment layer may be used instead of the color filter 230, and hereinafter the stacked structure of an embodiment applying the reflection adjustment layer 235 instead of the color filter 230 is described through FIG. 28.

Figure 28:
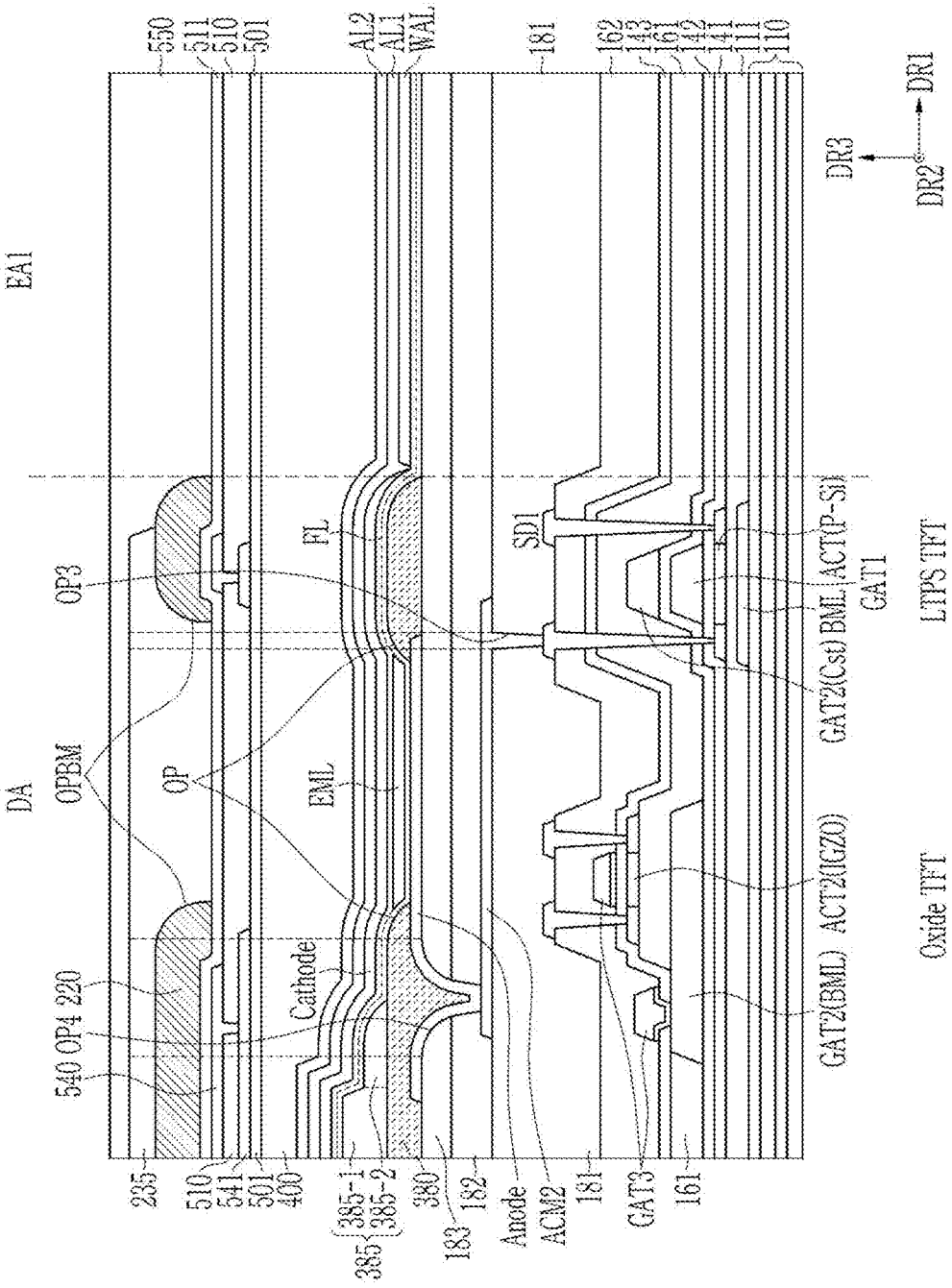
FIG. 28 is a schematic cross-sectional view of a light emitting display device according to another embodiment.

FIG. 28 is a schematic cross-sectional view of a light emitting display device according to another embodiment.

FIG. 28 is the cross-sectional view corresponding to FIG. 7, and the parts that differ from FIG. 7 are explained.

A reflection adjustment layer 235 may be disposed on the light blocking member 220. The reflection adjustment layer 235 may selectively absorb light of a wavelength of some band among light reflected from the inside of the display device or incident from the outside of the display device. The reflection adjustment layer 235 may fill the opening OP of the light blocking member 220.

For example, the reflection adjustment layer 235 absorbs the first wavelength region of about 490 nm to about 505 nm and the second wavelength region of about 585 nm to about 600 nm, so that the light transmittance in the first wavelength region and the second wavelength region may be provided to be about 40% or less. The reflection adjustment layer 235 may absorb light with a wavelength outside the light emitting wavelength range of red, green, or blue emitted by the light emitting diode ED. As such, as the reflection adjustment layer 235 absorbs light of the wavelength that may not belong to the wavelength range of red, green, or blue emitted from the light emitting diode (LED), it may be possible to prevent or minimize the decreasing in the luminance of the display device and simultaneously prevent or minimize the deterioration of the light emitting efficiency of the display device and improve visibility.

In an embodiment, the reflection adjustment layer 235 may be provided as an organic material layer including a dye, a pigment, or a combination thereof. The reflection adjustment layer 235 may include tetraazaporphyrin (TAP)-based compound, porphyrin-based compound, metal porphyrin-based compound, oxazine-based compound, squarylium-based compound, triarylmethane-based compound, polymethine-based compound, anthraquinone-based compound, phthalocyanine-based compound, azo-based compound, perylene-based compound, xanthene-based compound, diimmonium-based compound, dipyrromethene-based compound, cyanine-based compound, or a combination thereof.

In an embodiment, reflectance measured by an SCI (Specular Component Included) mode on the reflection adjustment layer 235 surface may be about 10% or less. For example, the reflection adjustment layer absorbs an external light reflection of the display device, so that the visibility may be improved.

In an embodiment, the reflection adjustment layer 235 may have the transmittance of about 64% to about 72%. The transmittance of the reflection adjustment layer 235 may be adjusted according to the content of the pigment and/or dye included in the reflection adjustment layer 235.

According to an embodiment, the reflection adjustment layer 235 may not be positioned in the first component area EA1.

Also, in an embodiment including the reflection adjustment layer 235, a capping layer AL1 and a low reflection layer AL2 may be additionally formed between the cathode Cathode and the encapsulation layer 400.

The capping layer AL1 may serve to improve the light emitting efficiency of a light emitting diode (LED) by a principle of constructive interference. The capping layer AL1 may include a material having a refractive index of about 1.6 or more for light having a wavelength of about 589 nm, for example.

The capping layer AL1 may be an organic capping layer including organic materials, an inorganic capping layer including inorganic materials, or a composite capping layer including organic materials and inorganic materials. For example, the capping layer AL1 may include a carbocyclic compound, a heterocyclic compound, an amine group-containing compound, a porphine derivative, a phthalocyanine derivative, a naphthalocyanine derivative, an alkali metal complex, an alkaline earth metal complex, or any combination thereof. The carbocyclic compounds, heterocyclic compounds, and amine group-containing compounds may be optionally substituted with substituents including O, N, S, Se, Si, F, Cl, Br, I, or any combination thereof.

A low reflection layer AL2 may be disposed on the capping layer AL1. The low reflection layer AL2 may overlap the entire surface of the substrate 110.

The low reflection layer AL2 may include an inorganic material having low reflectance, and in an embodiment, a metal or a metal oxide. In case that the low reflection layer AL2 includes a metal, for example, ytterbium (Yb), bismuth (Bi), cobalt (Co), molybdenum (Mo), titanium (Ti), zirconium (Zr), aluminum (Al), chromium (Cr), niobium (Nb), platinum (Pt), tungsten (W), indium (In), tin (Sn), iron (Fe), nickel (Ni), tantalum (Ta), manganese (Mn), zinc (Zn), germanium (Ge), silver (Ag), magnesium (Mg), gold (Au), copper (Cu), calcium (Ca), or a combination thereof may be included. In case that the low reflection layer AL2 includes the metal oxide, for example, $SiO_2$, $TiO_2$, $ZrO_2$, $Ta_2O_5$, $HfO_2$, $Al_2O_3$, ZnO, $Y_2O_3$, BeO, MgO, $PbO_2$, $WO_3$, SiNx, LiF, $CaF_2$, $MgF_2$, CdS, or a combination thereof may be included.

In an embodiment, an absorption coefficient (k) of the inorganic material included in the low reflection layer AL2 may be about 4.0 or less and about 0.5 or more ($0.5 \leq k \leq 4.0$). The inorganic material included in the low reflection layer AL2 may have a refractive index (n) of about 1 or more ($n \geq 1.0$).

The low reflection layer AL2 may induce destructive interference between the light incident into the display device and the light reflected from the metal disposed under the low reflection layer AL2, thereby reducing external light reflectivity. Accordingly, the display quality and visibility of the display device may be improved by reducing the reflectance of the external light of the display device through the low reflection layer AL2.

According to an embodiment, the capping layer AL1 may be omitted so that the low reflection layer AL2 may be in contact with the cathode Cathode.

Figure 17:
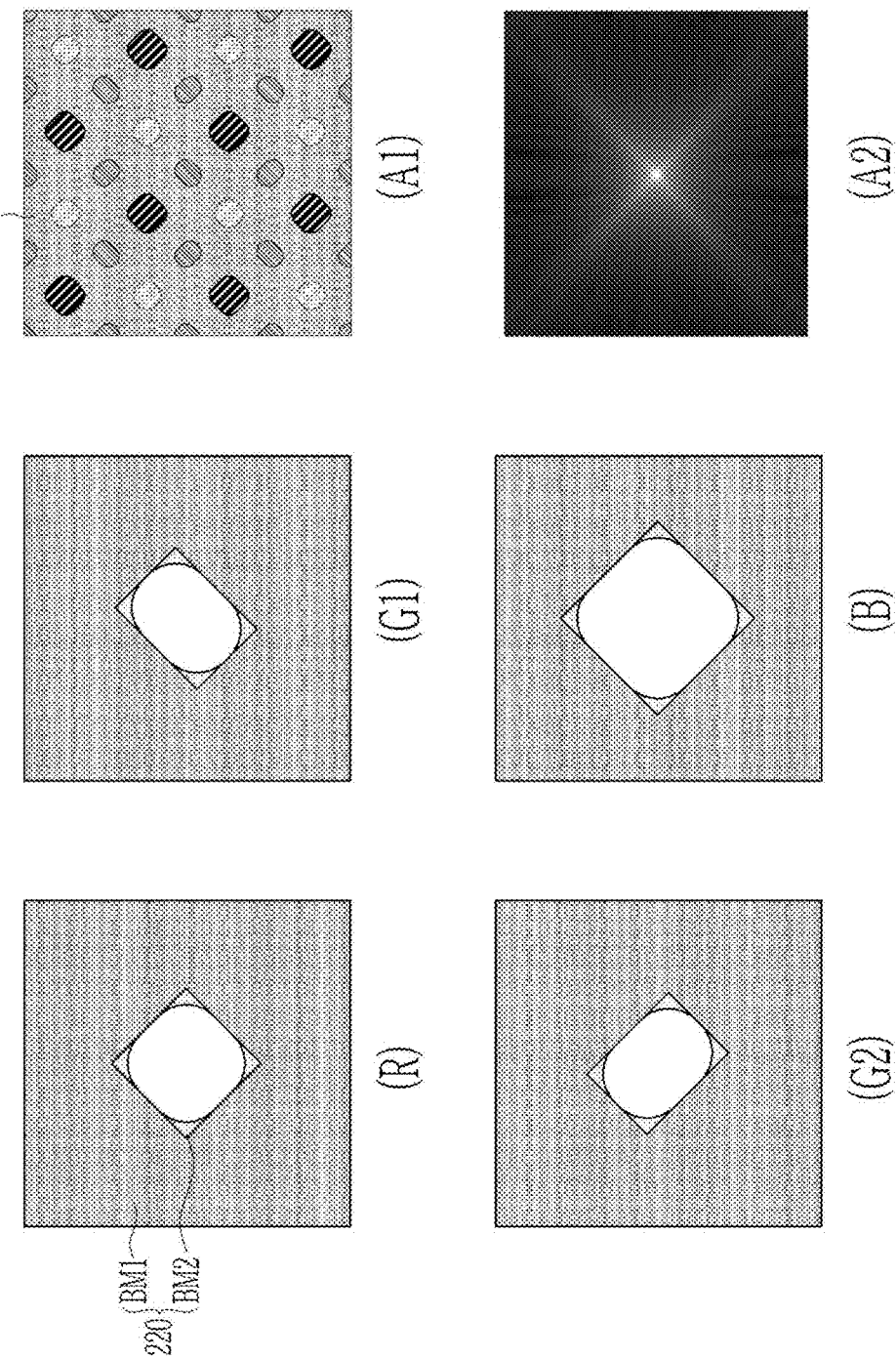
Figure 18:
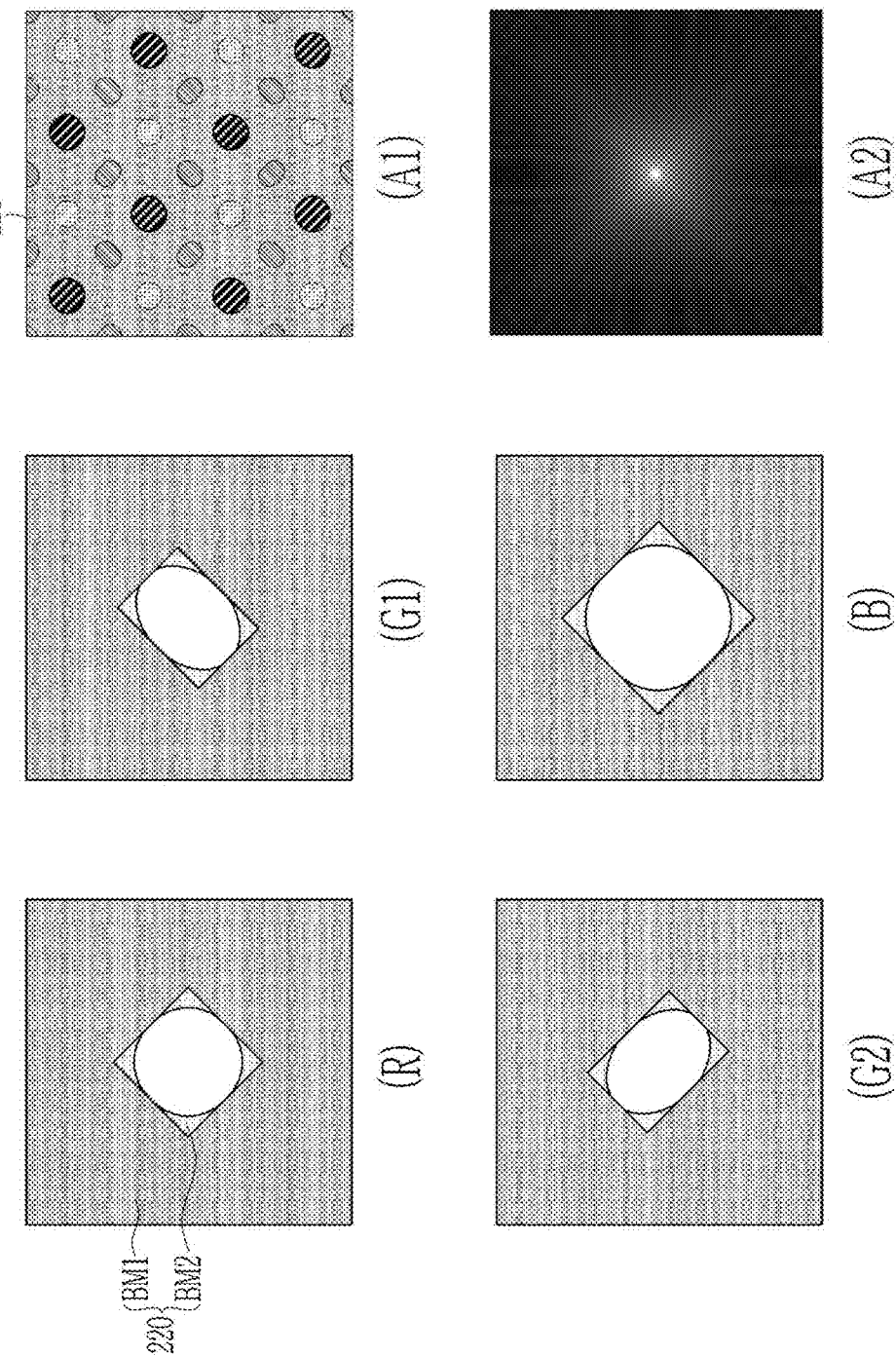
Figure 19:
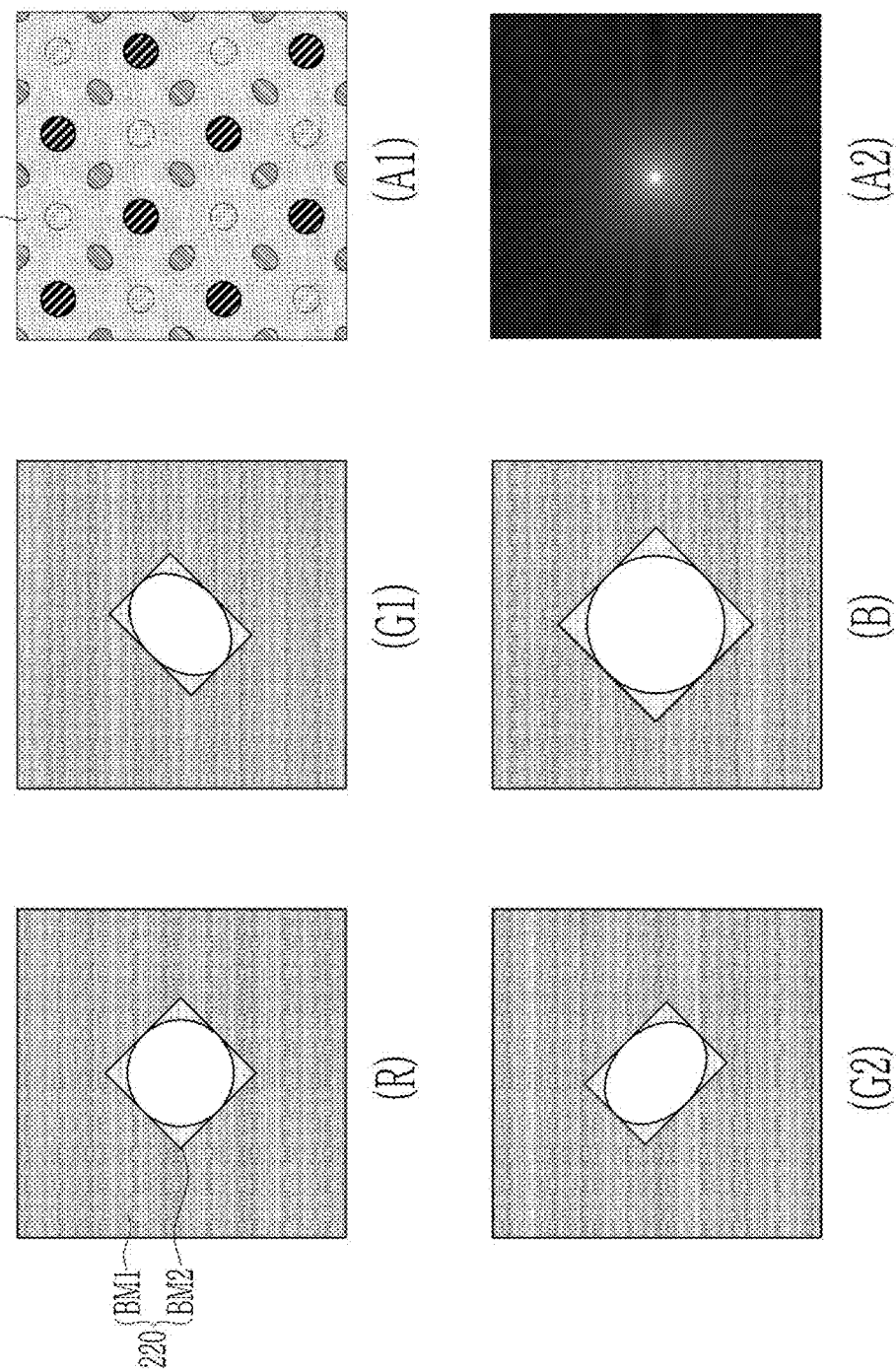
Figure 20:
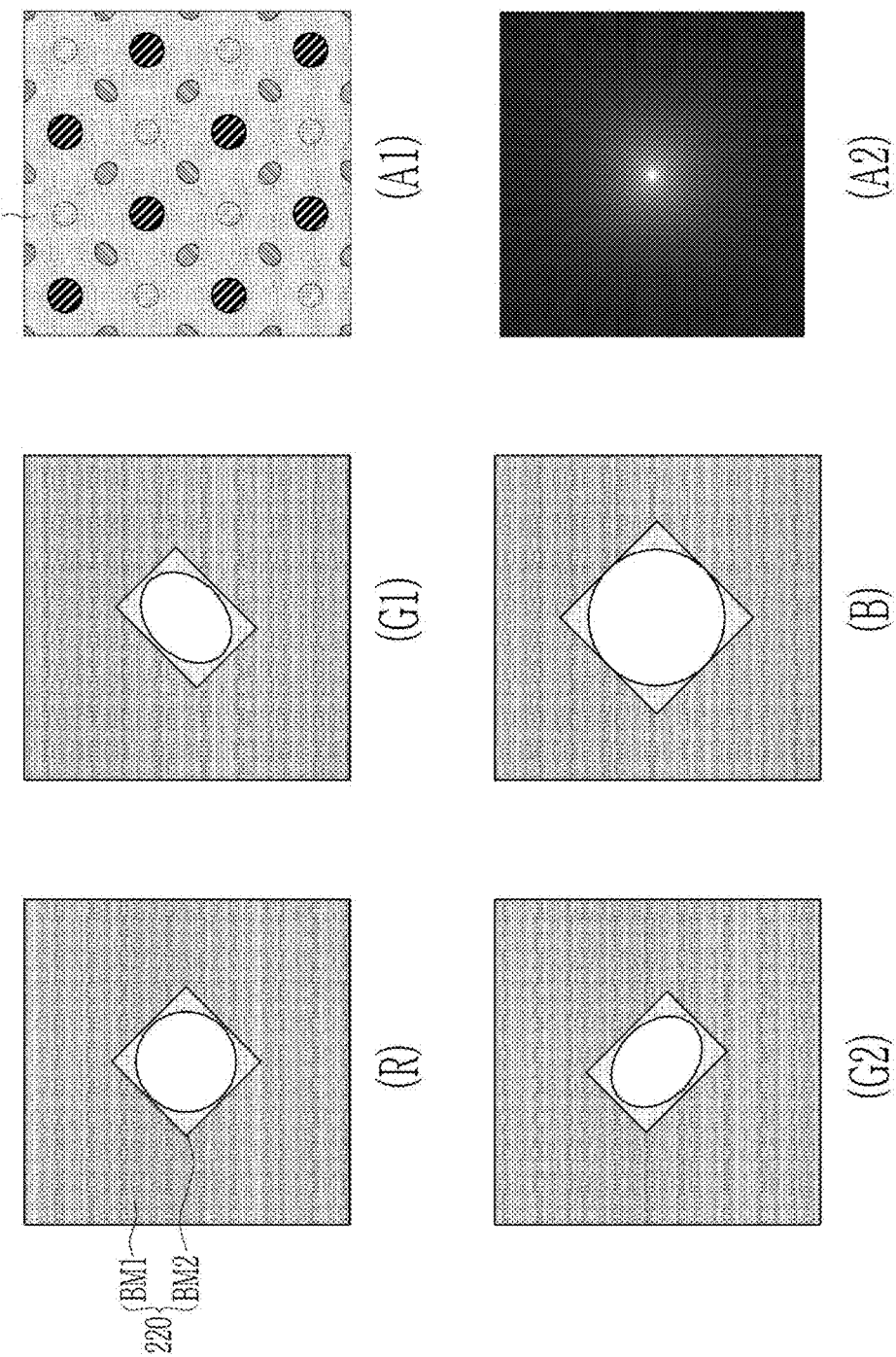

An encapsulation layer 400 may be positioned on the low reflection layer AL2, and the other structures may be the same as those of FIG. 17, and a description thereof is omitted.

On the other hand, in first component area EA1, the cathode Cathode formed in the display area may not be formed, and in an embodiment, in the first component area EA1, the low adhesive layer WAL may be positioned at the cathode Cathode position. The low adhesive layer WAL may be positioned on the functional layer FL in the first component area EA1. The low adhesive layer WAL may be a material with weak adherence, and according to an embodiment, the cathode Cathode may not be disposed on the upper surface of the low adhesive layer WAL, or may include a material having a characteristic in which the cathode Cathode may be formed of a very thin film.

For example, the low adhesive layer WAL may be formed by using a material such as 8-quinolinato lithium (Liq; [8-quinolinolato lithium]), N,N-diphenyl-N,N-bis(9-phenyl-9H-carbazole-3-yl)biphenyl-4,4'-diamine (HT01), N(diphenyl-4-yl)9,9-dimethyl-N-(4(9-phenyl-9H-carbazole-3-yl) phenyl)-9H-fluorene-2-amine (HT211), 2-(4-(9,10-di (naphthalene-2-yl)anthracene-2-yl)phenyl)-1-phenyl-1H-benzo-[D]imidazole (LG201), etc.

This specification shows and describes an embodiment in which the low adhesive layer WAL may be positioned in the first component area EA1, but in another embodiment, it may be removed through a laser process or the like. The laser process may be a laser process performed on the cathode Cathode.

In the first component area EA1, on the low adhesive layer WAL, the capping layer AL1 and the low reflection layer AL2, and the encapsulation layer 400, may be disposed.

While this disclosure has been described in connection with what is considered to be practical embodiments, it is to be understood that the disclosure is not limited to the disclosed embodiments. On the contrary, the disclosure is intended to include various modifications and equivalent arrangements included within the spirit and scope of the disclosure.

What is claimed is:

1. A light emitting display device comprising:
   a substrate;
   pixel circuit parts positioned on the substrate;
   light emitting diodes (LED) electrically connected to the pixel circuit parts;
   an encapsulation layer covering at least one of the pixel circuit parts and at least one of the light emitting diodes (LED); and
   a light blocking member positioned on the encapsulation layer and including a red opening, a blue opening, and a green opening, wherein
   the red opening, the blue opening, and the green opening have a mass center, a first position closest to the mass center, and a second position furthest from the mass center,
   in case that a ratio of a distance from the mass center to the second position to a distance from the mass center to the first position is referred to as a maximum minimum distance ratio:
      the red opening has a value of about 1.02 or more and about 1.15 or less as the maximum minimum distance ratio,
      the blue opening has a value of about 1.05 or more and about 1.2 or less as the maximum minimum distance ratio, and
      the green opening has a value of about 1.32 or more and about 1.38 or less as the maximum minimum distance ratio.

2. The light emitting display device of claim 1, wherein the red opening, the blue opening, and the green opening have a hybrid structure including a straight line and a curved line.

3. The light emitting display device of claim 2, wherein the light blocking member includes a plurality of openings formed of one red opening, one blue opening, and two green openings as a unit.

4. The light emitting display device of claim 3, wherein the two green openings are long in different directions.

5. The light emitting display device of claim 4, wherein an angle formed by two directions in which the two green openings extend is about 90 degrees.

6. The light emitting display device of claim 2, further comprising:
   color filters of different colors that are positioned in the red opening, the blue opening, and the green opening.

7. The light emitting display device of claim 2, further comprising:
   a reflection adjustment layer filling the red opening, the blue opening, and the green opening and formed on the light blocking member.

8. A light emitting display device comprising:
   a substrate;
   pixel circuit parts positioned on the substrate;
   light emitting diodes (LED) electrically connected to the pixel circuit parts;

an encapsulation layer covering at least one of the pixel circuit parts and at least one of the light emitting diodes (LED);

a light blocking member positioned on the encapsulation layer and including a red opening, a blue opening, and a green opening; and a reflection adjustment layer filling the red opening, the blue opening, and the green opening and formed on the light blocking member, wherein the red opening, the blue opening, and the green opening have a mass center, a first position closest to the mass center, and a second position furthest from the mass center, wherein, in case that a ratio of a distance from the mass center to the second position to a distance from the mass center to the first position is referred to as a maximum minimum distance ratio:

the red opening has a value of about 1.02 or more and about 1.15 or less as the maximum minimum distance ratio, the blue opening has a value of about 1.05 or more and about 1.2 or less as the maximum minimum distance ratio, and the green opening has a value of about 1.32 or more and about 1.38 or less as the maximum minimum distance ratio, wherein the red opening, the blue opening, and the green opening have a hybrid structure including a straight line and a curved line, and wherein:

the light emitting diodes (LEDs) include a cathode; and the light emitting display device further includes a low reflection layer positioned between the cathode and the encapsulation layer.

9. The light emitting display device of claim 8, further comprising:

a capping layer positioned between the cathode and the low reflection layer.

10. The light emitting display device of claim 8, further comprising:

a low adhesive layer formed at a part where the cathode is not formed.

11. A manufacturing method of a light emitting display device, comprising:

forming an initial opening in a light blocking member;

applying a Gaussian filter to the initial opening and the light blocking member; and applying a threshold value to the initial opening and the light blocking member to which the Gaussian filter is applied to form a final opening, wherein the final opening includes a red opening, a blue opening, and a green opening, the Gaussian filter to form the red opening has a full width at half maximum value of about 8 μm or more and about 12 μm or less, the Gaussian filter to form the blue opening has a full width at half maximum value of about 8 μm or more and about 14 μm or less, and the Gaussian filter to form the green opening has a full width at half maximum of about 8 μm or more and about 10 μm or less.

12. The manufacturing method of the light emitting display device of claim 11, wherein the initial opening only includes a straight line and does not include a curved line.

13. The manufacturing method of the light emitting display device of claim 12, wherein the initial opening has a quadrangle shape.

14. The manufacturing method of the light emitting display device of claim 13, wherein the final opening is formed by a hybrid structure including a straight line and a curved line.

15. The manufacturing method of the light emitting display device of claim 14, wherein the red opening, the blue opening, and the green opening have a mass center, a first position closest to the mass center, and a second position furthest from the mass center, in case that a ratio of a distance from the mass center to the second position to a distance from the mass center to the first position is referred to as a maximum minimum distance ratio:

the red opening has a value of about 1.02 or more and about 1.15 or less as the maximum minimum distance ratio, the blue opening has a value of about 1.05 or more and about 1.2 or less as the maximum minimum distance ratio, and the green opening has a value of about 1.32 or more and about 1.38 or less as the maximum minimum distance ratio.

16. The manufacturing method of the light emitting display device of claim 11, wherein in the forming of the final opening, the threshold value is about 50%, a value above the threshold value is changed to a maximum gray, and a value below the threshold value is changed to a minimum gray to form the final opening.

17. The manufacturing method of the light emitting display device of claim 11, wherein the full width at half maximum value for forming the red opening, the full width at half maximum value for forming the blue opening, and the full width at half maximum value for forming the green opening are different from each other.

18. The manufacturing method of the light emitting display device of claim 17, wherein in case that the full width at half maximum value is small, it is close to the initial opening, and in case that the full width at half maximum value is large, a curved line component increases.

19. The manufacturing method of the light emitting display device of claim 17, wherein the full width at half maximum for forming the blue opening is the largest, the full width at half maximum for forming the red opening is next largest, and the full width at half maximum for forming the green opening is the smallest.

20. The manufacturing method of the light emitting display device of claim 19, wherein the full width at half maximum value for forming the blue opening is about 14 μm, the full width at half maximum value for forming the red opening is about 12 μm, and the full width at half maximum value for forming the green opening is about 10 μm.

* * * * *